(12) United States Patent
Kato et al.

(10) Patent No.: US 8,536,067 B2
(45) Date of Patent: Sep. 17, 2013

(54) SEMICONDUCTOR DEVICE AND METHOD FOR MANUFACTURING THE SAME

(75) Inventors: Kiyoshi Kato, Atsugi (JP); Takehisa Sato, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 2 days.

(21) Appl. No.: 13/157,592

(22) Filed: Jun. 10, 2011

(65) Prior Publication Data
US 2011/0237033 A1 Sep. 29, 2011

Related U.S. Application Data

(62) Division of application No. 11/501,899, filed on Aug. 10, 2006.

(30) Foreign Application Priority Data

Aug. 12, 2005 (JP) ................................. 2005-234589

(51) Int. Cl.
*H01L 51/40* (2006.01)

(52) U.S. Cl.
USPC ............... 438/780; 438/623; 257/E27.104; 257/E51.003

(58) Field of Classification Search
None
See application file for complete search history.

(56) References Cited

U.S. PATENT DOCUMENTS

| | | | |
|---|---|---|---|
| 5,742,129 A | 4/1998 | Nagayama et al. | |
| 5,853,905 A | 12/1998 | So et al. | |
| 5,977,562 A * | 11/1999 | Hirakata et al. | 257/72 |
| 6,054,809 A | 4/2000 | Haynes et al. | |
| 6,246,179 B1 | 6/2001 | Yamada | |
| 6,268,617 B1 | 7/2001 | Hirakata et al. | |
| 6,307,528 B1 | 10/2001 | Yap | |
| 6,380,687 B1 | 4/2002 | Yamazaki | |

(Continued)

FOREIGN PATENT DOCUMENTS

| | | |
|---|---|---|
| EP | 1482556 A | 12/2004 |
| EP | 1484799 A | 12/2004 |

(Continued)

OTHER PUBLICATIONS

Office Action (Application No. 200610111014.6) dated Jun. 5, 2009.

*Primary Examiner* — Calvin Lee
*Assistant Examiner* — Abul Kalam
(74) *Attorney, Agent, or Firm* — Eric J. Robinson; Robinson Intellectual Property Law Office, P.C.

(57) ABSTRACT

A memory element is formed by providing an organic compound between a pair of upper and lower electrodes. However, when the electrode is formed over a layer containing an organic compound, a temperature is limited because the layer containing the organic compound can be influenced depending on a temperature for forming the electrode. A forming method for the electrode is limited due to this limitation of a temperature. Therefore, there are problems that an expected electrode cannot be formed, and miniaturization of an element is inhibited. A semiconductor device includes a memory element and a switching element which are provided over a substrate having an insulating surface. The memory element includes first and second electrodes, and a layer containing an organic compound, which are provided on the same plane. A current flows from the first electrode to the second electrode. The first electrode is electrically connected to the switching element.

21 Claims, 10 Drawing Sheets

(56) References Cited

U.S. PATENT DOCUMENTS

| | | |
|---|---|---|
| 6,512,271 B1 | 1/2003 | Yamazaki et al. |
| 6,528,815 B1 | 3/2003 | Brown et al. |
| 6,569,544 B1 | 5/2003 | Alain et al. |
| 6,603,140 B2 | 8/2003 | Kobori et al. |
| 6,833,560 B2 | 12/2004 | Konuma et al. |
| 6,855,977 B2 | 2/2005 | Krieger et al. |
| 6,977,389 B2 | 12/2005 | Tripsas et al. |
| 7,015,504 B2 | 3/2006 | Lyons et al. |
| 7,019,457 B2 | 3/2006 | Fukunaga |
| 7,132,693 B2 | 11/2006 | Konuma et al. |
| 7,184,289 B2 | 2/2007 | Andideh et al. |
| 7,196,368 B2 | 3/2007 | Kimura et al. |
| 7,205,570 B2 | 4/2007 | Kim et al. |
| 7,242,469 B2 | 7/2007 | Wang et al. |
| 7,359,230 B2 | 4/2008 | Sumida et al. |
| 7,384,792 B1 | 6/2008 | Wang et al. |
| 7,416,681 B2 | 8/2008 | Kim et al. |
| 7,428,046 B2 | 9/2008 | Wang et al. |
| 7,460,224 B2 | 12/2008 | Wang et al. |
| 7,576,854 B2 | 8/2009 | Wang et al. |
| 7,660,145 B2 | 2/2010 | Nomura |
| 7,713,578 B2 | 5/2010 | Hirai |
| 7,790,469 B2 | 9/2010 | Wang et al. |
| 7,791,573 B2 | 9/2010 | Kim et al. |
| 7,795,617 B2 | 9/2010 | Koyama et al. |
| 7,812,938 B2 | 10/2010 | Guo et al. |
| 7,892,489 B2 | 2/2011 | Wang et al. |
| 7,929,133 B2 | 4/2011 | Wang et al. |
| 7,956,997 B2 | 6/2011 | Wang et al. |
| 8,031,335 B2 | 10/2011 | Wang et al. |
| 8,081,308 B2 | 12/2011 | Wang et al. |
| 8,101,983 B2 | 1/2012 | Seo et al. |
| 8,102,525 B2 | 1/2012 | Guo et al. |
| 8,164,130 B2 | 4/2012 | Seo et al. |
| 2001/0049030 A1 | 12/2001 | Okada et al. |
| 2004/0129936 A1* | 7/2004 | Park et al. ................ 257/40 |
| 2004/0240261 A1* | 12/2004 | Kano .......................... 365/158 |
| 2005/0224977 A1 | 10/2005 | Yoshimura et al. |
| 2006/0157772 A1* | 7/2006 | Sumida et al. ............. 257/314 |
| 2006/0267068 A1 | 11/2006 | Sato et al. |
| 2010/0070197 A1 | 3/2010 | Wang et al. |
| 2010/0296086 A1 | 11/2010 | Wang et al. |
| 2011/0140209 A1 | 6/2011 | Wang et al. |
| 2011/0212512 A1 | 9/2011 | Wang et al. |
| 2012/0086021 A1 | 4/2012 | Wang |

FOREIGN PATENT DOCUMENTS

| | | |
|---|---|---|
| EP | 1947696 A | 7/2008 |
| EP | 2164104 A | 3/2010 |
| JP | 01-259564 A | 10/1989 |
| JP | 05-202356 | 8/1993 |
| JP | 11-504749 | 4/1999 |
| JP | 2002-026277 | 1/2002 |
| JP | 2004-128471 A | 4/2004 |
| JP | 2004-193620 A | 7/2004 |
| JP | 2004-363604 A | 12/2004 |
| JP | 2005-019955 A | 1/2005 |
| JP | 2005-183619 A | 7/2005 |
| JP | 2005-217088 A | 8/2005 |
| WO | WO-97/30445 | 8/1997 |
| WO | WO-2004/015778 | 2/2004 |
| WO | WO-2005/060001 | 6/2005 |
| WO | WO 2006/043573 | 4/2006 |
| WO | WO 2006/043611 | 4/2006 |
| WO | WO 2006/043687 | 4/2006 |
| WO | WO 2006/051996 | 5/2006 |
| WO | WO 2006/057417 | 6/2006 |
| WO | WO 2006/059554 | 6/2006 |
| WO | WO 2006/059746 | 6/2006 |
| WO | WO 2006/062143 | 6/2006 |
| WO | WO 2006/062175 | 6/2006 |
| WO | WO 2006/064859 | 6/2006 |
| WO | WO-2007/149120 | 12/2007 |

* cited by examiner

SEMICONDUCTOR DEVICE AND METHOD FOR MANUFACTURING THE SAME

BACKGROUND OF THE INVENTION

1. Field of the Invention

The present invention relates to a semiconductor device which can store data.

In this specification, a semiconductor device generally means a device which can function by utilizing semiconductor characteristics, and an electro-optic device, a semiconductor circuit, and an electronic device are all semiconductor devices.

2. Description of the Related Art

A memory element generally has a structure in which two electrodes as two terminals of the memory element are provided above and below a dielectric layer.

In Patent Document 1 (Japanese Patent Laid-Open No.: 2002-26277), a memory device is proposed, in which electrodes as two terminals of an element are provided above and below a layer containing an organic compound, voltage is applied to the electrodes to cause short-circuit, and information is stored by setting an initial state to be "0" and a conducted state to be "1", and a method for driving the memory device is also proposed.

As a memory circuit provided in the semiconductor device, a DRAM (Dynamic Random Access Memory), an SRAM (Static Random Access Memory), an FeRAM (Ferroelectric Random Access Memory), a mask ROM (Masked Read Only Memory), an EPROM (Electrically Programmable Read Only Memory), an EEPROM (Electrically Erasable and Programmable Read Only Memory), a flash memory, and the like are given. Among them, a DRAM and an SRAM are volatile memory circuits in which data are erased when power is turned off; therefore, it is necessary to write data every time the power is turned on. An FeRAM is a nonvolatile memory circuit, and the number of manufacturing steps thereof is increased because a capacitor including a ferroelectric layer is used in an FeRAM. A mask ROM has a simple structure; however, it is necessary to write data during manufacturing steps thereof, and data cannot be additionally written. An EPROM, an EEPROM, and a flash memory are nonvolatile memory circuits; however, there is a problem that the number of manufacturing steps thereof is increased because an element having two gate electrodes is used in an EPROM, an EEPROM, and a flash memory.

In addition, a memory circuit such as a DRAM using an inorganic material for a dielectric substance, stores two values by presence or absence of charge stored in a capacitor.

On the other hand, in a memory circuit using an organic compound for a dielectric substance, a memory element is formed by providing an organic compound between a pair of upper and lower electrodes. However, when the electrode is formed over a layer containing an organic compound, a temperature is limited because the layer containing an organic compound can be influenced depending on a temperature for forming the electrode. A forming method for the electrode is limited due to this limitation of a temperature and an expected electrode cannot be formed. Therefore, there are problems that miniaturization of an element is inhibited. A problem caused by an electrode formed over a layer containing an organic compound is required to be solved from an aspect of inhibition of element miniaturization.

In addition, in a case of an organic memory element where a pair of electrodes as two terminals is formed above and below a layer containing an organic compound, a pair of electrodes is required to be formed by a plurality of steps because a pair of electrodes is provided above and below the layer containing an organic compound. Therefore, there is a problem that a manufacturing process becomes complicated. The complicated manufacturing process is a problem that is required to be solved from an aspect of a manufacturing cost.

SUMMARY OF THE INVENTION

In view of the foregoing problems, it is an object of the present invention to overcome inhibition of element miniaturization and a complicated manufacturing process. It is another object of the present invention to provide a nonvolatile memory device in which data can be additionally written other than in manufacturing and forgery and the like due to rewriting can be prevented, and to provide a semiconductor device including the memory device. In addition, it is also an object to provide a nonvolatile memory device and a semiconductor device which are highly reliable and inexpensive.

In view of the foregoing problems, the present invention provides a memory element in which a first conductive layer and a second conductive layer functioning as two terminals of the memory element are provided over the same insulating layer.

In addition, in the present invention, voltage is applied between two terminals of an element and a pair of electrodes is conducted by short-circuit of the electrodes or a change in conductivity of a layer containing an organic compound which is caused by a change of the layer containing an organic compound. Further, voltage is applied in parallel to a substrate surface to the layer containing an organic compound, and a pair of electrodes is conducted. An element of the present invention can store two values corresponding to "initial state" and "state after conductivity change". The element of the present invention is an element having a structure in which a potential difference is generated between the pair of electrodes and a current path which is formed between the pair of electrodes is irreversibly changed from a high-resistance state to a low-resistance state.

In a structure 1 of the present invention that is disclosed in this specification, as an example is shown in FIGS. 1A, 1B, and 1C, a semiconductor device includes a plurality of elements and a plurality of switching elements which are arranged in matrix over a substrate having an insulating surface. The element includes a pair of electrodes provided on the same plane and a layer containing an organic compound provided on the same plane. A current flows in a direction parallel to the substrate surface and in a direction from one to the other of the pair of electrodes in the element. The layer containing an organic compound is provided between the pair of the electrodes, and one of the pair of electrodes is electrically connected to the switching element.

A gate line (gate electrode) of the switching element corresponds to a word line. In addition, there are at least two electrodes electrically connected to a semiconductor layer of the switching element, because each of the two electrodes is connected either a source region or a drain region included in the semiconductor layer. A bit line intersecting with the word line is electrically connected to the semiconductor layer of the switching element. Further, in this specification, a pair of electrodes provided on the same plane are also referred to as a first electrode and a second electrode, and the electrode electrically connected to the semiconductor layer of the switching element is referred to as the first electrode. In addition, the second electrode opposed to the first electrode corresponds to a common line (common electrode). For example, in the case where the switching element is an n-channel thin film transistor, the bit line is connected to a drain region of the n-channel thin film transistor, and the first electrode is connected to a source region of the n-channel thin film transistor. Moreover, in the case where the switching element is a p-channel thin film transistor, the bit line is connected to a source region of the p-channel thin film transistor, and the first electrode is connected to a drain region of the p-channel thin film transistor.

In addition, in the structure 1, the layer containing an organic compound may be in contact with at least a part of one side surface of the first electrode and a part of the side surface of the common line opposed to the one side surface of the first electrode.

In addition, the layer containing an organic compound may be surrounded by a pair of insulating layers, the first electrode, and the second electrode. In a structure 2 of the present invention, a semiconductor device includes a plurality of elements and a plurality of switching elements which are arranged in matrix over a substrate having an insulating surface. The element includes a pair of electrodes provided on the same plane, a layer containing an organic compound and a pair of insulating layer on the same plane. A current flows in a direction parallel to the substrate surface and in a direction from one to the other of the pair of electrodes in the element. The layer containing an organic compound is surrounded by the pair of insulating layer and the pair of electrodes, and one of the pair of electrodes is electrically connected to the switching element.

The pair of insulating layers are provided for controlling the position where the layer containing an organic compound is formed and are also referred to as partition walls. Further, the pair of insulating layers is provided in a region between one element and a memory element adjacent to the element. In a structure 2 of the present invention, layer containing an organic compound is sandwiched between the pair of electrodes in a direction of a current path whose direction is parallel to the substrate surface and direction from one to the other of the pair of electrodes, and is sandwiched between the pair of insulating layers in a direction perpendicular to the current path.

In addition, in the structure 2, the pair of insulating layer is provided on both sides of the current path so as to sandwich the current path.

In addition, in the structure 1 or 2, as an example is shown in FIG. 1A, one of the features is that the total width (Wa+Wc) of the pair of electrodes is wider than the width (Wx) of the layer containing an organic compound. The total width of the pair of electrodes and the width of the layer containing an organic compound here mean a width in a cross-section including the pair of electrodes. In addition, the shortest current path in a cross-section including the pair of electrodes corresponds to a distance (Wb) between the pair of electrodes. The width (Wx) including at least the layer containing an organic compound is equal to or more than the distance (Wb) between the pair of electrodes.

In addition, the layer containing an organic compound is provided between the common line and the first electrode, various pattern shapes seen from the top surface may be used without particular limitations. For example, a shape of the layer containing an organic compound when viewed from above is a rectangular shape, an elliptical shape, a circular shape, or a band shape. The layer containing an organic compound is not formed over the entire surface, but the layer containing an organic compound is formed selectively, so that consumption of a material can be suppressed.

In addition, as an example is shown in FIGS. 2A and 2B, the layer containing an organic compound may be formed in a pattern which has a band shape when viewed from above, and may be shared by the plurality of elements adjacent to each other in a direction of the current path. In this case, the total width of the pair of electrodes is smaller than the width of the layer containing an organic compound, that is to say length of the pattern having a band shape. Note that as another method for forming the layer containing an organic compound in a band-shape pattern, a droplet discharge method (representatively an ink-jet method or a dispensing method) may be used. In addition, the layer containing an organic compound is provided between the common line and the bit line which are adjacent to each other, so that the distance (Wd) between the common line and the bit line which are adjacent to each other is preferably wider than the distance (Wb) between the first electrode and the common line, is specifically 2 μm or more. In addition, a pair of insulating layers is provided so as to control the position where the layer containing an organic compound is formed In addition, as an example is shown in FIGS. 3A and 3B, the layer containing an organic compound may be formed so as to partially overlap with the first electrode and the common line, and may cover a side surface of the first electrode, an upper end portion thereof, a side surface of the common line opposed to the side surface of the first electrode, and an upper end portion thereof. The width Wx of the layer containing an organic compound in FIG. 3A is wider than the width (Wx) of the layer containing an organic compound in FIG. 1A.

In addition, as an example is shown in FIGS. 4A and 4B, the layer containing an organic compound may be formed in a pattern which has a band shape when viewed from above without providing a pair of partition walls, and may be shared by a plurality of elements adjacent to each other in a direction of a current path.

In addition, as an example is shown in FIGS. 5A and 5B, a structure, in which an insulating layer is formed over a connection electrode and a bit line, and a first electrode, a second electrode, and a layer containing an organic compound are formed over the insulating layer, may be used. Note that the connection electrode is electrically connected to the first electrode through a contact hole provided in the insulating layer. The area of the element can be reduced by providing the insulating layer over the connection electrode and the bit line.

In addition, in the structure 1 or 2, one of the features is that a side surface of the bit line, the side surface of the first electrode, and the side surface of the common line opposed to the side surface of the first electrode are tapered. In this specification, having a tapered shape at the side surface of the electrode (or a wire) means that a side wall surface of the electrode (or the wire) is inclined to the substrate surface. Note that in this specification, a tapered shape does not mean a shape in which the upper end portion of the electrode (or the wire) protrudes, that is to say, an overhang shape.

Distance between lower end portions of the pair of opposite electrodes can be reduced and an electric field is easily concentrated by providing such a tapered shape, so that the layer containing an organic compound provided in the current path at comparatively low power can be irreversibly changed from a high-resistance state to a low-resistance state. In this specification, having a tapered shape at the side surface of the electrode (or the wire) means a shape formed when the side wall surface of the electrode (or the wire) is inclined. Note that in this specification, a tapered shape does not mean a shape in which the upper end portion of the electrode (or the wire) protrudes, that is to say, an overhang shape.

A manufacturing process for achieving the structure 1 is also an aspect of the present invention. The present invention is a method for manufacturing a semiconductor device which includes the steps of forming a semiconductor layer over a substrate having an insulating surface, forming an insulating film which covers the semiconductor layer, forming a pair of electrodes one of which is electrically connected to the semiconductor layer, on the same plane over the insulating film, and selectively forming a layer containing an organic compound between the pair of electrodes.

In the structure of the present invention relating to the above-mentioned manufacturing method, one of the features is that the side surface of the bit line, the side surface of the first electrode, and the side surface of the common line are formed to have a tapered shape in forming the pair of electrodes. By forming to have the tapered shape, coverage of a film to be formed thereover can be improved. In addition, in the case where the method for forming a layer containing an organic compound is a droplet discharge method, a material solution is discharged on a region between the pair of electrodes (the first electrode and the common line). Even when a discharge position is misaligned, an insulating surface which is exposed between the pair of electrodes can be covered by the layer containing an organic compound, as long as the material solution can be discharged on the side surface of the electrode having a tapered shape. It is because that the material solution shifts to the insulating surface between the pair of electrodes along the side surface of the pair of electrodes having tapered shape.

A manufacturing process for achieving the structure 2 is also an aspect of the present invention. The present invention is a method for manufacturing a semiconductor device which includes the steps of forming a semiconductor layer over a substrate having an insulating surface, forming an insulating film which covers the semiconductor layer, forming a pair of electrodes one of which is electrically connected to the semiconductor layer, on the same plane over the insulating film, forming a pair of insulating layer over the insulating film, and selectively forming a layer containing an organic compound so as to overlap a region surrounded by the pair of electrodes and the pair of insulating layer.

In the structure of the present invention relating to the manufacturing method, one of features is that at least a side surface of the pair of electrodes sandwiching a layer containing an organic compound, which is in contact with the layer containing an organic compound, is formed to have a tapered shape in forming the pair of electrodes. In addition, one of features is that at least a side surface of the pair of insulating layer sandwiching the layer containing an organic compound, which is in contact with the layer containing an organic compound, is formed to have a tapered shape in forming the pair of insulating layer.

By the present invention, advantageous effect such as element miniaturization and a simplified manufacturing process can be achieved.

In addition, a memory device and a semiconductor device according to the present invention includes a memory element having a simple structure in which a layer containing an organic compound is interposed between a pair of electrodes over the same insulating layer, and thus, an inexpensive memory device and semiconductor device can be provided.

DESCRIPTION OF THE INVENTION

Figure 1A:
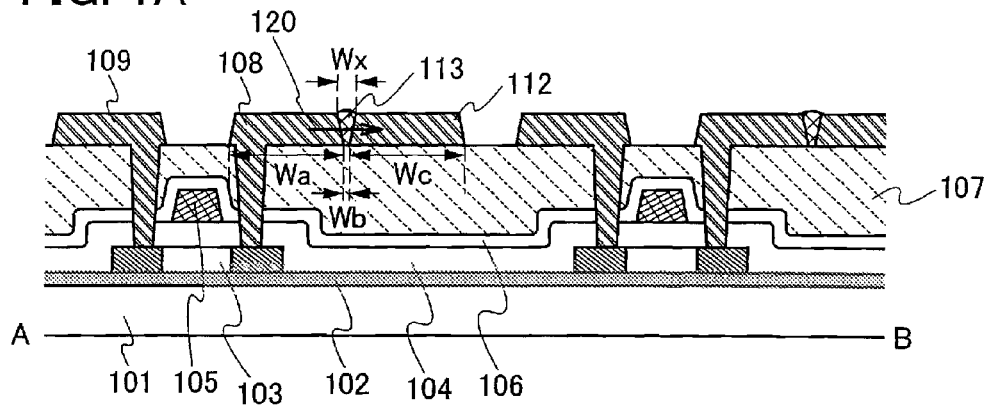
FIGS. 1A and 1C are cross-sectional views of a semiconductor device according to the present invention and FIG. 1B is a top view thereof (Embodiment Mode 1)

Hereinafter, embodiment modes of the present invention will be described with reference to the drawings. However, it is to be easily understood by those skilled in the art that the present invention can be implemented in many different ways, and modes and details herein disclosed can be modified in various ways without departing from the purpose and the scope of the present invention. Therefore, the present invention should not be interpreted as being limited to the description of the embodiment modes to be given below. Through the drawings of the embodiment modes, the same components or components having the same functions are denoted by the same reference numerals and will not be further explained.
(Embodiment Mode 1)

In this embodiment mode, an example of a structure of a memory element included in a semiconductor device according to the present invention will be explained with reference to drawings. More specifically, an example of a structure of a memory circuit in which a plurality of memory elements is arranged in matrix will be described.

Figure 1B:
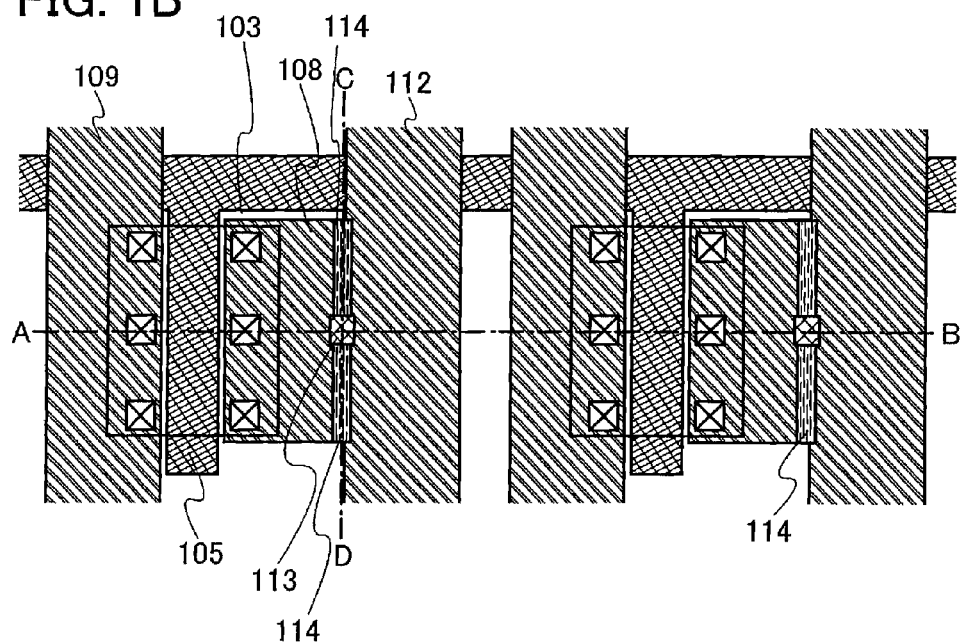
Figure 1C:
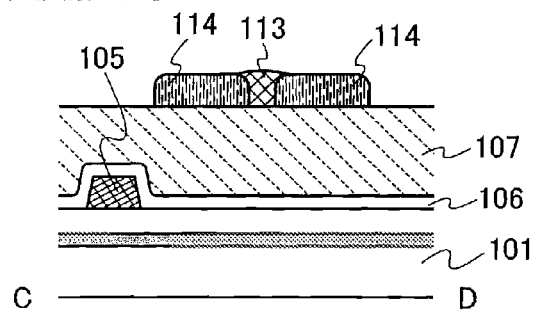

FIG. 1A shows a part of a cross-sectional structure of a memory cell array including a plurality of memory elements according to the present invention. FIG. 1B is a top view, and a cross-section taken along a chain line A-B in FIG. 1B corresponds to FIG. 1A. Further, FIG. 1C shows a cross-sectional structure taken along a chain line C-D in FIG. 1B.

Openings (contact holes) which reach a semiconductor layer 103 are provided in a second insulating layer 104, a third insulating layer 106, and a fourth insulating layer 107. A bit line 109, a first electrode 108, and a common electrode (second electrode) 112 are provided so as to cover these openings. In addition, the first electrode 108 and the common electrode 112 which are electrically connected to the semiconductor layer 103 through the openings, are provided over the fourth insulating layer 107. In FIG. 1A, the bit line 109, the first electrode 108, and the common electrode 112 are provided over one layer, that is to say, over the fourth insulating layer 107.

Here, an example in which an n-channel thin film transistor is used as a switching element is shown. The semiconductor layer 103, a gate line (word line) 105, the first electrode 108 serving as a source electrode, and the bit line 109 serving as a drain electrode form an n-channel thin film transistor. The n-channel thin film transistor is electrically connected to a memory element which is formed of the first electrode 108, the common electrode 112, and a layer 113 containing an organic compound.

Note that in the case of using a p-channel transistor instead of the n-channel thin film transistor, the bit line functions as a source electrode of the thin film transistor, and the first electrode functions as a drain electrode of the thin film transistor.

The semiconductor layer 103 includes at least a channel forming region, a source region, and a drain region. Furthermore, in order to reduce an off-current value, the n-channel thin film transistor may have an LDD (Lightly Doped Drain) structure. The LDD structure is a structure in which a region with an impurity element added at low concentration, which is referred to as an LDD region, is provided between the channel forming region and the source region or the drain region formed by adding the impurity element at high concentration. The LDD structure has an advantageous effect of reducing the electric field near the drain to prevent deterioration due to hot-carrier injection. Moreover, in order to prevent lowering of the on-current value due to the hot carrier, the n-channel thin film transistor may have a GOLD (Gate-drain Overlapped LDD) structure. The GOLD structure, which is a structure in which an LDD region is overlapped with a gate electrode with a gate insulating film interposed therebetween, has an advantageous effect of further relaxing the electric field near the drain than the LDD structure to prevent deterioration due to hot-carrier injection. Thus, the GOLD structure is effective in preventing the deterioration by relaxing the electric field intensity near the drain to prevent the hot-carrier injection.

Further, an amorphous semiconductor film, a semiconductor film having a crystalline structure, a compound semiconductor film having an amorphous structure, or the like can be used as the semiconductor layer 103 as appropriate. Furthermore, a semi-amorphous semiconductor film (also referred to as a microcrystalline semiconductor film) can also be used as an active layer of a TFT. The semi-amorphous semiconductor film has an intermediate structure between an amorphous structure and a crystalline structure (also including a single crystal structure and a polycrystalline structure), and is in a third state that is stable in term of free energy, and includes a crystalline region having a short-range order with lattice distortion. There is no particular limitation on the material of the semiconductor layer 103; alternatively, silicon, silicon germanium (SiGe) alloy or the like may be preferably used as the material of the semiconductor layer 103. In addition, an organic compound such as pentacene can be used as the semiconductor layer 103.

As long as a transistor can function as a switching element, the present invention can be applied regardless of a structure of the switching element. FIG. 1A shows an example in which a top-gate thin film transistor is provided over a substrate having insulating properties; however, a bottom gate (inverted staggered) TFT or a staggered TFT can be employed. In addition, a multi-gate TFT having a plurality of channel formation regions, for example a double-gate TFT, may be used without limitation to a TFT having a single-gate structure.

The semiconductor layer 103, the gate line (word line) 105, the first electrode 108 serving as a source electrode or a drain electrode, and the bit line 109 serving as a source electrode or a drain electrode form a transistor. The first electrode 108 serving as the source electrode or the drain electrode forms a memory element together with the common electrode 112 and the layer 113 containing an organic compound.

In this manner, the first electrode 108, the common electrode 112, and the layer 113 containing an organic compound are formed over the fourth insulating layer 107, so that the memory element which includes the first electrode 108, the common electrode 112, and the layer 113 containing an organic compound can be freely provided.

The word line (gate line) 105 is a control signal line for selecting one row from the memory cell array. In the memory cell array, a plurality of memory cells is arranged in matrix. One memory cell is provided between the common electrode 112 and a transistor provided at an intersection point of the bit line 109 and the word line (gate line) 105, and can be read or written by increasing voltage of a word line corresponding to an address where reading or writing is performed.

In addition, the bit line 109 is a signal line for taking data from the memory cell array. In a memory cell connected to the word line (gate line) 105 to which voltage is applied, data is read by which data stored in the memory element is outputted to the bit line 109.

Further, the layer 113 containing an organic compound is provided between the first electrode 108 and the common electrode 112, and in contact with the first electrode 108 and the common electrode 112. A memory element of the present invention includes the layer 113 containing an organic compound, and the first electrode 108 and the common electrode 112, which sandwich the layer 113 containing an organic compound in a direction that is parallel to the substrate surface. The layer 113 containing an organic compound can be formed by using a substance in which a crystal state, conductivity, or a shape are changed by electric action, typically, an organic compound or a mixture of an organic compound and an inorganic compound.

The memory element having the structure as described above can store two values corresponding to "initial state" and "state after conductivity change" because conductivity of the memory element is changed by electric action. Note that the electric action means applying voltage to the first electrode and the common electrode so that current flows through the layer containing an organic compound.

Here, change in conductivity of the memory element before and after applying voltage is explained.

When voltage is applied between the side surface of the first electrode 108 and the side surface of the common electrode 112, conductivity of the layer 113 containing an organic compound is changed, and conductivity of the memory element is increased. In addition, when voltage is applied between the side surface of the first electrode 108 and the side surface of the common electrode 112, the first electrode 109 and the common electrode 112 are short-circuited in some cases. Further, when voltage is applied between the side surface of the first electrode 109 and the side surface of the common electrode 112, there is also a case where conductivity is obtained when dielectric breakdown is caused in the layer 113 containing an organic compound. This is because an electric field tends to concentrate on the end portion of the electrode and dielectric breakdown is easily caused in the layer containing an organic compound. In any case, two values corresponding to "initial state" and "state after conductivity change" can be stored in the memory element because conductivity is changed by electric action. Note that dielectric breakdown means a phenomenon that an insulator is broken electrically and loses insulating properties, thereby a current flows in the insulator, when voltage applied to the insulator exceeds a certain limit. A similar phenomenon is generated when the layer containing an organic compound is taken as an insulator; though the layer containing an organic compound is not an insulator depending on a material, therefore, it is also referred to as that dielectric breakdown is caused in the layer containing an organic compound.

As an organic compound that can be applied to the layer 113 containing an organic compound, in which conductivity is changed by external electric action, an organic compound having a high hole-transporting property or a high electron-transporting property can be used.

As the organic compound having a high hole-transporting property, an aromatic amine-based (namely, including a benzene ring-nitrogen bond) compound such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), 4,4',4"-tris[N-(3-methylphenyl)-N-phenyl-amino]-triphenylamine (abbreviation: MTDATA), or 4,4'-bis(N-(4-(N,N-di-m-tolylamino)phenyl)-N-phenylamino)biphenyl (abbreviation: DNTPD), or a phthalocyanine compound such as phthalocyanine (abbreviation: $H_2Pc$), copper phthalocyanine (abbreviation: CuPc), or vanadyl phthalocyanine (abbreviation: VOPc) can be used. The substances described here are mainly substances having hole mobility of $10^{-6}$ cm$^2$/Vs or more. However, a substance other than the substances as described above may be used as long as the substance has a higher transporting property of holes than that of electrons.

In a case of providing a mixed layer of an organic compound and an inorganic compound as the layer containing an organic compound, it is preferable to mix an organic compound having a high hole-transporting property and an inorganic compound which easily receives electrons. In accordance with the above described the layer containing an organic compound, a number of hole carriers are generated in an organic compound which has originally few inherent carriers, and the organic compound obtains a hole injecting property and transporting property which are extremely excellent. As a result, the layer containing the organic compound can obtain excellent conductivity.

As the inorganic compound which easily receives electrons, metal oxide, metal nitride, or metal oxynitride of a transition metal which belongs to any of Group 4 to Group 12 in the periodic table can be used. Specifically, titanium oxide (TiOx), zirconium oxide (ZrOx), vanadium oxide (VOx), molybdenum oxide (MoOx), tungsten oxide (WOx), tantalum oxide (TaOx), hafnium oxide (HfOx), niobium oxide (NbOx), cobalt oxide (Cox), rhenium oxide (ReOx), ruthenium oxide (RuOx), zinc oxide (ZnO), nickel oxide (NiOx), copper oxide (CuOx), or the like can be used. Although oxide is given as a specific example here, nitride or oxynitride thereof may be used as a matter of course.

As the organic compound having a high electron-transporting property, a material formed of a metal complex having a quinoline skeleton or a benzoquinoline skeleton, such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolato-aluminum (abbreviation: BAlq), or the like can be used. In addition, a material such as a metal complex having an oxazole-based Or thiazole-based ligand, such as bis[2-(2-hydroxyphenyl)benzoxazolato]zinc (abbreviation: Zn(BOX)$_2$), bis[2-(2-hydroxyphenyl)benzothiazolato]zinc (abbreviation: Zn(BTZ)$_2$), or the like can be used. Furthermore, in addition to a metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used. The substances described here are mainly substances having electron mobility of $10^{-6}$ cm$^2$/Vs or more. However, a substance other than the substances as described above may also be used as long as the substance has a higher transporting property of electrons than that of holes.

In a case of providing a mixed layer of an organic compound and an inorganic compound as the layer containing the organic compound, it is preferable to mix an organic compound having a high electron-transporting property and an inorganic compound which easily donates electrons. In accordance with the above described the layer containing the organic compound, a number of electron carriers are generated in an organic compound which has originally few inherent carriers, and the organic compound obtains an electron injecting property and transporting property which are extremely excellent. As a result, the layer containing the organic compound can obtain excellent conductivity.

As the inorganic compound which easily donates electrons, alkali metal oxide, alkaline earth metal oxide, rare-earth metal oxide, alkali metal nitride, alkaline earth metal nitride, or rare-earth metal nitride can be used. Specifically, lithium oxide (LiOx), strontium oxide (SrOx), barium oxide (BaOx), erbium oxide (ErOx), sodium oxide (NaOx), lithium nitride (LiNx), magnesium nitride (MgNx), calcium nitride (CaNx), yttrium nitride (YNx), lanthanum nitride (LaNx), or the like can be used.

Further, as the inorganic compound, any inorganic compound may be used as long as the inorganic compound easily receives electrons from an organic compound or the inorganic compound easily donates electrons to an organic compound, and various metal oxide, metal nitride, or metal oxynitride can be used in addition to aluminum oxide (AlOx), gallium oxide (GaOx), silicon oxide (SiOx), germanium oxide (GeOx), indium tin oxide (ITO), or the like.

In addition, in a case where the layer 113 containing an organic compound is formed by using a compound selected from metal oxide or metal nitride and a compound having a high hole-transporting property, a compound having large steric hindrance (having not a planar structure but a spatial structure) may be further added. As the compound having large steric hindrance, 5,6,11,12-tetraphenyltetracene (abbreviation: rubrene) is preferable. Alternatively, hexaphenylbenzene, t-butylperylene, 9,10-di(phenyl)anthracene, coumarin 545T, or the like can be used. Further, dendrimer or the like is also effective.

Furthermore, a light emitting substance such as 4-dicyanomethylene-2-methyl-6-[2-(1,1,7,7-tetramethyljulolidin-9-yl)ethenyl]-4H-pyran (abbreviation: DCJT), 4-dicyanomethylene-2-tert-butyl-6-[2-(1,1,7,7-tetramethyljulolidin-9-yl)ethenyl]-4H-pyran, periflanthene, 2,5-dicyano-1,4-bis[2-(10-methoxy-1,1,7,7-tetramethyljulolidin-9-yl)ethenyl]benzene, N,N'-dimethylquinacridone (abbreviation: DMQd), coumarin 6, coumarin 545T, tris(8-quinolinolato)aluminum (abbreviation: Alq$_3$), 9,9'-bianthryl, 9,10-diphenyl anthracene (abbreviation: DPA), 9,10-di(2-naphthyl)anthracene (abbreviation: DNA), or 2,5,8,11-tetra-t-butylperylene (abbreviation: TBP) may be provided between a layer formed by using an organic compound having a high electron-transporting property and a layer formed by using an organic compound having a high hole-transporting property.

The layer 113 containing an organic compound can be formed by an evaporation method, an electron beam evaporation method, a sputtering method, a CVD method, or the like. The mixed layer containing an organic compound and an inorganic compound can be formed by depositing each material at the same time and can be formed by combining the same type of methods or different types of methods, such as co-evaporation by resistance-heating evaporations, co-evaporation by electron beam evaporations, co-evaporation by resistance-heating evaporation and electron beam evaporation, deposition by resistance-heating evaporation and sputtering, or deposition by electron beam evaporation and sputtering.

In addition, as another method for forming the layer 113 containing an organic compound, a spin coating method, a sol-gel method, a printing method, a droplet discharge method (an ink-jet method or a dispensing method), or the like may be used, or a combination of the above-described method and these methods may also be used.

The layer 113 containing an organic compound has such a film thickness that conductivity of a memory element is changed by external electric action. The typical film thickness of the layer 113 containing an organic compound is 5 to 100 nm, preferably, 10 to 60 nm.

As shown in FIG. 1A, the layer 113 containing an organic compound is in contact with one side surface (a tapered side surface) of the common electrode 112. Further, the side surface of a first electrode 108, opposed to the side surface of the common electrode 112 that is in contact with the layer 113 containing an organic compound, is also in contact with the layer 113 containing an organic compound.

In addition, as shown in FIGS. 1B and 1C, a pair of fifth insulating layers 114 (also referred to as a pair of partition walls 114) is provided so as to sandwich the layer 113 containing an organic compound. The pair of fifth insulating layers 114 is formed to have a film thickness of 0.1 to 0.5 μm in a direction perpendicular to the substrate surface. Since the layer 113 containing an organic compound is surrounded by the first electrode 108, the common electrode 112, and the pair of fifth insulating layers 114 as shown in FIG. 1B, a highly fluid material can also be used as an organic material used for the layer 113 containing an organic compound.

In FIG. 1B, the shape of the layer 113 containing an organic compound is rectangular when viewed from above; however, it may be square, elliptical or circular without particular limitations. The shape of the layer 113 containing an organic compound when viewed from above can be easily controlled by a deposition method. For example, when a layer 113 containing an organic compound is formed by a resistance heating evaporation method or an electron beam evaporation method with an evaporation mask having a rectangular opening, the layer 113 containing an organic compound with a rectangular shape can be obtained. In this manner, when the layer 113 containing an organic compound is formed separately for each memory cell, the influence of an electric field between adjacent memory cells in a lateral direction can be reduced.

In order to reduce the number of manufacturing steps, it is preferable to form the bit line 109, the first electrode 108, and the common electrode 112 by using the same material in the same step. Further, in order to precisely control the distances between the bit line 109, the first electrode 108, and the common electrode 112, it is preferable to pattern the bit line 109, the first electrode 108, and the common electrode 112 using the same photomask.

The distance (Wb) between the first electrode 108 and the common electrode 112 that are formed over the same insulating layer, which is parallel to the substrate surface, is desirably 0.1 to 0.05 μm, preferably, 0.01 μm or less in length. In addition, a shortest distance in current path 120 in a cross-section including the first electrode 108 and the common electrode 112 which are a pair of electrodes, corresponds to the distance (Wb) between the pair of electrodes. Writing can be performed at low voltage by reducing the distance between the first electrode 108 and the common electrode 112. In other words, writing can be performed with low power consumption.

In addition, the total width (Wa+Wc) of the first electrode 108 and the common electrode 112 is preferably made wider than the width (Wx) of the layer 113 containing an organic compound.

The word line (gate line) 105, the bit line 109, the first electrode 108, and the common electrode 112 are formed by an evaporation method, a sputtering method, a CVD method, a printing method, an electroplating method, an electroless plating method, a droplet discharge method, or the like. The present invention is particularly effective in a case where a material having low heat resistance is used as a material for the layer 113 containing an organic compound. In the present invention, the word line (gate line) 105, the bit line 109, the first electrode 108, and the common electrode 112 are formed before the layer 113 containing an organic compound. Therefore, a method for forming a wire and electrodes, particularly a deposition temperature is not limited. Accordingly the present invention has the advantage that various methods for forming a wire and electrodes can be used.

The word line (gate line) 105, the bit line 109, the first electrode 108, and the common electrode 112 are formed by using a highly conductive element, compound, or the like. Typically, an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), or the like, or an alloy containing a plurality of the elements, can be used as a material thereof. As the alloy containing a plurality of the elements, for example, an alloy containing Al and Ti, an alloy containing Al, Ti and C, an alloy containing Al and Ni, an alloy containing Al and C, an alloy containing Al, Ni, and C, an alloy containing Al and Mo, or the like can be used.

In addition, the word line (gate line) 105, the bit line 109, the first electrode 108, and the common electrode 112 can be formed by using materials different from each other. Further, the word line (gate line) 105, the bit line 109, the first electrode 108, and the common electrode 112 may be formed by methods different from each other as well.

By adjusting etching conditions in patterning as appropriate, the bit line 109, the first electrode 108, and the common electrode 112 having a tapered side surface can be formed. When the bit line 109, the first electrode 108, and the common electrode 112 are formed in the same step, the bit line 109, the first electrode 108, and the common electrode 112 have the same tapered side surfaces. That the electrodes and the bit line have the tapered side surface means that the electrode side surface or the bit line side surface is inclined with respect to the substrate surface. The side surfaces of the bit line 109, the first electrode 108, and the common electrode 112 preferably have an angle of gradient (tapered angle) of 10° or more but less than 85°, more preferably, 60° or more and 80° or less with respect to the substrate surface.

The memory element shown in FIGS. 1A, 1B, and 1C has a structure in which voltage is applied to the layer 113 containing an organic compound in a direction parallel to the substrate surface. The area of the memory element can be reduced by reducing the distance between the first electrode 108 and the common electrode 112.

Hereinafter, an example of a method for manufacturing the memory element shown in FIGS. 1A, 1B, and 1C will be described.

First, a first insulating layer 102 is formed over a substrate 101 having an insulating surface.

Subsequently, a semiconductor layer is formed over the first insulating layer 102. Then, the semiconductor layer 103 is formed by selectively etching the semiconductor layer by using a photolithography method or the like. Next, a second insulating layer 104 is formed over the semiconductor layer 103 and the first insulating layer 102. Then, a conductive layer is formed over the second insulating layer. Then, the conductive layer is selectively etched by using a photolithography method or the like to form the word line (gate line) 105. Subsequently, a third insulating layer 106 is formed over the word line (gate line) 105 and the second insulating layer. Next, a fourth insulating layer 107 is formed over the third insulating layer 106. Next, the second insulating layer, the third insulating layer, and the fourth insulating layer are etched selectively by using a photolithography method or the like to form openings which reach the semiconductor layer 103. Next, a conductive layer is formed over the fourth insulating layer 107 and the openings which reach the semiconductor layer 103. The conductive layer is etched selectively by using a photolithography method or the like to form the bit line 109, the first electrode 108, and the common electrode 112. And an insulating layer is formed over the bit line 109, the first electrode 108, and the common electrode 112. The insulating layer is etched selectively by using a photolithography method or the like to form a pair of fifth insulating layers 114. Note that the second insulating layer 104, the third insulating layer 106, the fourth insulating layer 107, and the pair of fifth insulating layers 114 can be formed without etching when a printing method or a droplet discharge method is used.

Then, a material solution containing an organic compound is dropped on a region surrounded by the first electrode 108, the common electrode 112, and the pair of fifth insulating layers 114 by using a droplet discharge method. The material solution containing an organic compound is dropped so as to fill in at least a space between the first electrode 108 and the common electrode 112. The dropped material solution containing an organic compound is fixed because it is surrounded by the first electrode 108, the common electrode 112, and the pair of fifth insulating layers 114. Then, baking is performed to form the layer 113 containing an organic compound.

Note that an example having the structure that a position in which the layer 113 containing an organic compound is formed does not overlap with the semiconductor layer 103 is shown here. However, the example shown here is not particularly limited to the above structure. The area occupied by one memory element can be reduced by providing the layer 113 containing an organic compound in a position overlapping the semiconductor layer 103 or the gate line.

In the memory element shown in FIGS. 1A, 1B, and 1C that is formed by the above described method for manufacturing thereof, the bit line, the first electrode 108 and the common electrode 112 which sandwich the layer 113 containing an organic compound can be formed at the same time, and thus, the number of forming steps thereof can be reduced.

(Embodiment Mode 2)

Figure 2A:
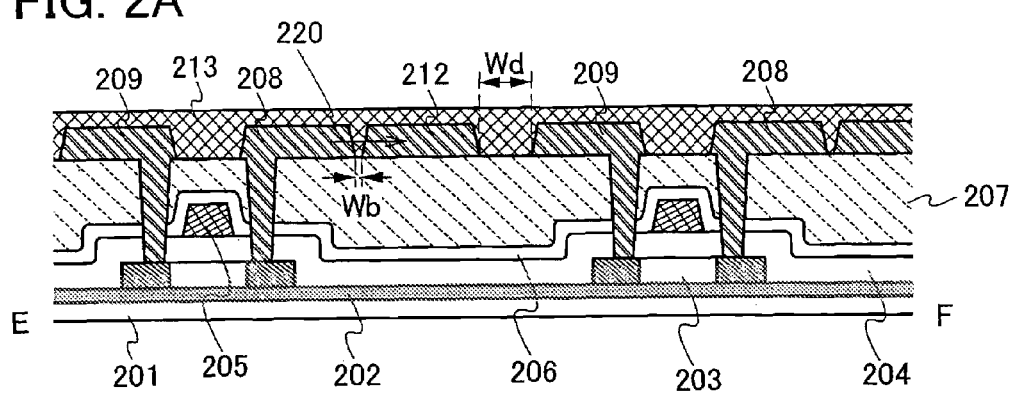
FIG. 2A is a cross-sectional view of a semiconductor device according to the present invention and FIG. 2B is a top view thereof (Embodiment Mode 2)
Figure 2B:
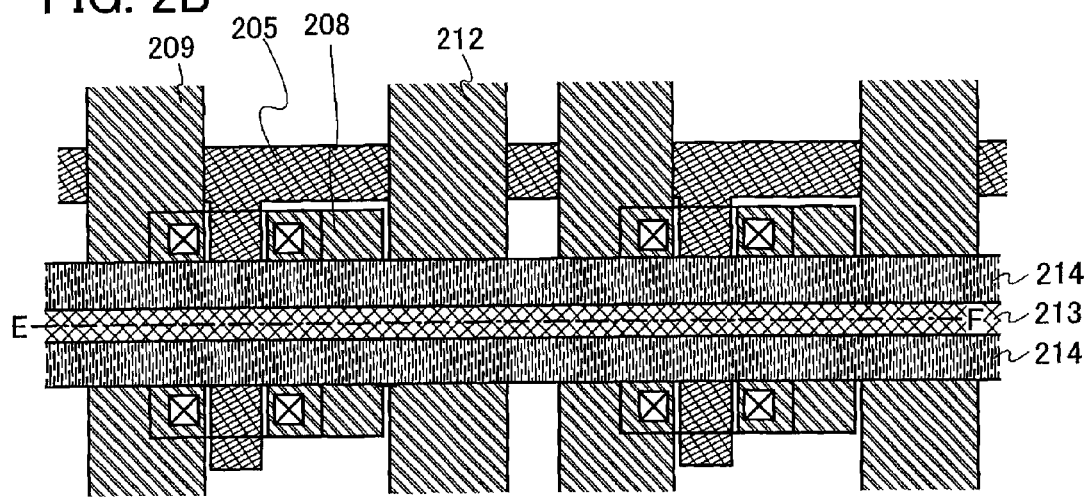

In this embodiment mode, FIGS. 2A and 2B show an example of a memory element which is partially different from the memory element shown in FIGS. 1A, 1B and 1C. FIG. 2A is a cross-sectional view of two memory elements, FIG. 2B is a top view of the two memory elements, and a diagram taken along a chain line E-F in FIG. 2B corresponds to FIG. 2A.

In FIG. 2A, similarly to FIG. 1A, a first insulating layer 202 is provided over a substrate 201 having an insulating surface, and a semiconductor layer 203 is provided over the first insulating layer 202. A second insulating layer 204 is provided over the first insulating layer 202 and the semiconductor layer 203. A word line (gate line) 205 is provided over the second insulating layer 204. A third insulating layer 206 is provided over the word line (gate line) 205, and a fourth insulating layer 207 is provided over the third insulating layer 206. A bit line 209, a first electrode 208, and a common electrode 212 are provided over the fourth insulating layer 207. The bit line 209, the first electrode 208, and the common electrode 212 are formed of the same material. A pair of right and left openings (contact holes), which reaches the semiconductor layer 203, is provided in the second insulating layer 204, the third insulating layer 206, and the fourth insulating layer 207. The bit line 209 is provided so as to cover one opening and the first electrode 208 is provided so as to cover the other opening. The bit line 209, the first electrode 208, and the common electrode 212 are provided over the same layer, that is, over the fourth insulating layer 207.

The semiconductor layer 203, the gate line (word line) 205, the first electrode 208, and the bit line 209 form a transistor.

In the memory element shown in FIG. 2A, a layer 213 containing an organic compound covers and is in contact with both side surfaces of the bit line 209, both side surfaces of the first electrode 208, and both side surfaces of the common electrode 212.

In addition, a shortest distance in current path 220, in a cross-section including the first electrode 208 and the common electrode 212 which are a pair of electrodes, corresponds to the distance (Wb) between the pair of electrodes.

Further, as shown in FIG. 2B, the layer 213 containing an organic compound is formed in a band shape (also referred to as a line-shape). In addition, an insulating layer (partition wall) may also be formed to fix the layer 213 containing an organic compound. In such a case, a pair of fifth insulating layers (a pair of partition walls) 214 is also formed in a band shape (also referred to as a line-shape) parallel to the layer 213 containing an organic compound. The pair of fifth insulating layers 214 is formed so as to sandwich the layer 213 containing an organic compound.

In FIG. 2B, the width of the layer 213 containing an organic compound is not particularly limited, and the width of the layer 213 containing an organic compound may also be wider than that of the pair of fifth insulating layers 214.

When viewed from above, the layer 213 containing an organic compound shown in FIG. 2B has a shape different from the layer 113 containing an organic compound shown in FIG. 1B. The memory element shown in FIG. 2B has a structure in which the width of the layer 213 containing an organic compound can be made wider, and thus, the allowable range of misalignment in forming the layer 213 containing an organic compound can be made wider.

In addition, the layer 213 containing an organic compound is provided between the common electrode 212 and the bit line 209, so that the distance (Wd) between the common electrode 212 and the bit line 209 which are adjacent to each other is preferably wider than the distance (Wb) between the first electrode and the common electrode, and specifically 2 μm or more. In a case where the distance (Wd) is equal to or narrower than the distance (Wb), a short circuit between the common electrode 212 and the bit line 209 which are adjacent to each other is caused. Therefore, there is a possibility that writing or the like is performed to the memory element. By providing the distance (Wd) wider than the distance (Wb) occurrence of malfunction can be prevented.

Further, in the memory element shown in FIG. 2A, a protective layer may also be provided so as to cover the fourth insulating layer 207, the bit line 209, the first electrode 208, the common electrode 212, and the layer 213 containing an organic compound.

This embodiment mode can be arbitrarily combined with Embodiment Mode 1.

(Embodiment Mode 3)

Figure 3A:
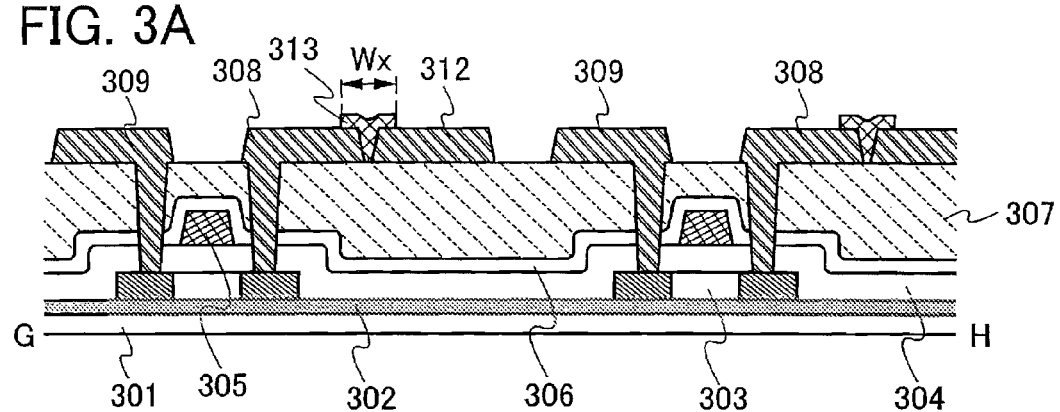
FIG. 3A is a cross-sectional view of a semiconductor device according to the present invention and FIG. 3B is a top view thereof (Embodiment Mode 3)
Figure 3B:
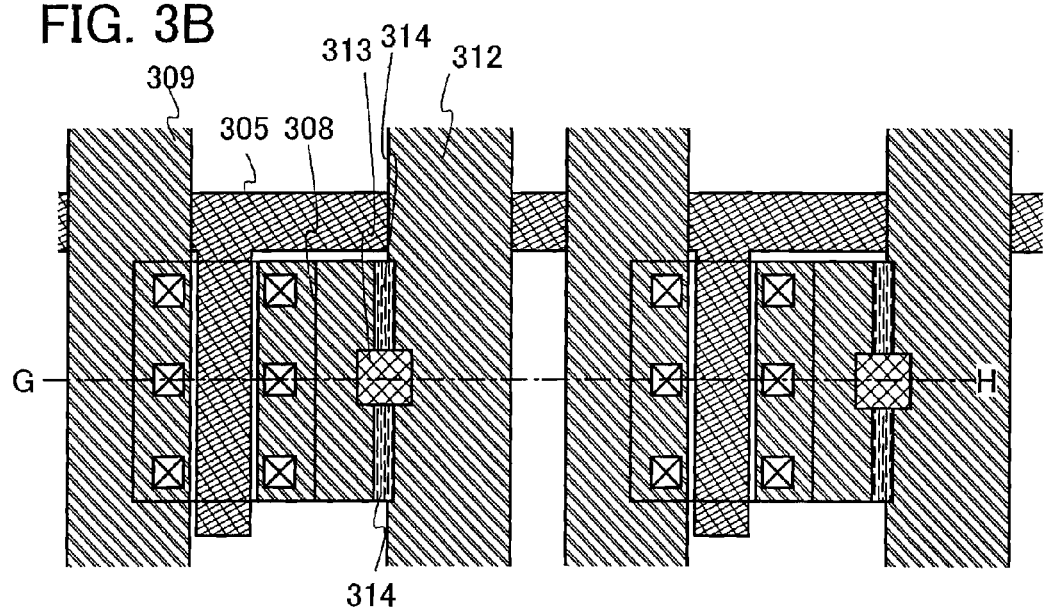

In this embodiment mode, FIGS. 3A and 3B show an example of a memory element which is partially different from the memory element shown in FIGS. 1A, 1B and 1C. FIG. 3A is a cross-sectional view of two memory elements, FIG. 3B is a top view of the two memory elements, and a diagram taken along a chain line G-H in FIG. 3B corresponds to FIG. 3A.

In FIG. 3A, similarly to FIG. 1A, a first insulating layer 302 is provided over a substrate 301 having an insulating surface, and a semiconductor layer 303 is provided over the first insulating layer 302. A second insulating layer 304 is provided over the first insulating layer 302 and the semiconductor layer 303. A word line (gate line) 305 is provided over the second insulating layer 304. A third insulating layer 306 is provided over the word line (gate line) 305, and a fourth insulating layer 307 is provided over the third insulating layer 306. A bit line 309, a first electrode 308, and a common electrode 312 are provided over the fourth insulating layer 307. The bit line 309, the first electrode 308, and the common electrode 312 are formed of the same material. Six openings in total which are pairs of right and left openings (contact holes), which reach the semiconductor layer 303, is provided in the second insulating layer 304, the third insulating layer 306, and the fourth insulating layer 307. The bit line 309 is provided so as to cover one of each pair of the openings and the first electrode 308 is provided so as to cover the other of each pair of the openings. The bit line 309, the first electrode 308, and the common electrode 312 are provided over the same layer, that is, over the fourth insulating layer 307. A pair of fifth insulating layers (a pair of partition walls) 314 is provided over the fourth insulating layer 307 so as to sandwich a layer 313 containing organic compound.

The semiconductor layer 303, the gate line (word line) 305, the first electrode 308, and the bit line 309 form a transistor.

In the memory element shown in FIGS. 3A and 3B, the layer 313 containing an organic compound has a cross-sectional shape and a shape when viewed from above that are different from those of the layer 113 containing an organic compound shown in FIG. 1A. FIG. 1A shows an example in which the layer 113 containing an organic compound is in contact with only one side surfaces of the first electrode 108 and the common electrode 112; meanwhile, in FIG. 3A, a layer 313 containing an organic compound is in contact with both of the side surface of the first electrode 308 and the common electrode 312 and in contact with a part of the top surfaces (top end portions) of the first electrode 308 and the common electrode 312. A shape of the layer 313 containing an organic compound when viewed from above is a rectangle shape in which a length of at least one side is (Wx).

Further, in the memory element shown in FIG. 3A, a protective layer may also be provided so as to cover the bit line 309, the first electrode 308, the common electrode 312, and the layer 313 containing an organic compound. In the memory elements shown in FIGS. 3A and 3B, the pair of electrodes can be filled with the layer containing the organic compound surely. Therefore, as every memory element can have uniform resistance, variations of resistance between the pair of electrodes of every memory element can be prevented. Further, forming the layer 313 containing the organic memory by etching using photolithography method or the like is easier to form the structure shown in FIGS. 1A to 1C.

This embodiment mode can be arbitrarily combined with Embodiment Mode 1 or 2.

(Embodiment Mode 4)

Figure 4A:
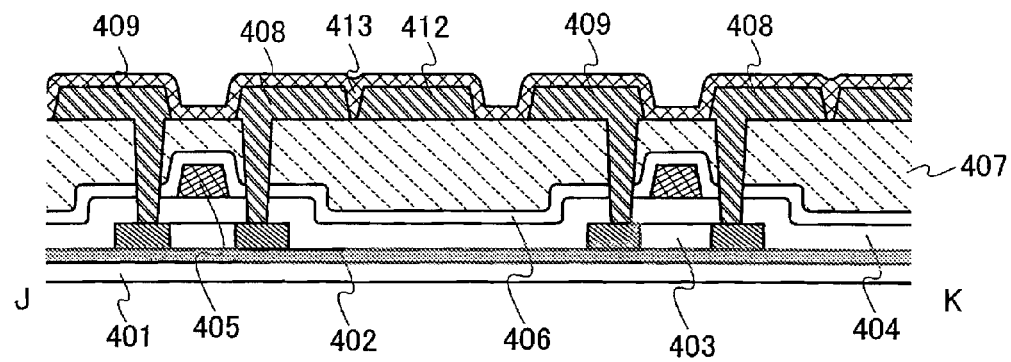
FIG. 4A is a cross-sectional view of a semiconductor device according to the present invention and FIG. 4B is a top view thereof (Embodiment Mode 4)
Figure 4B:
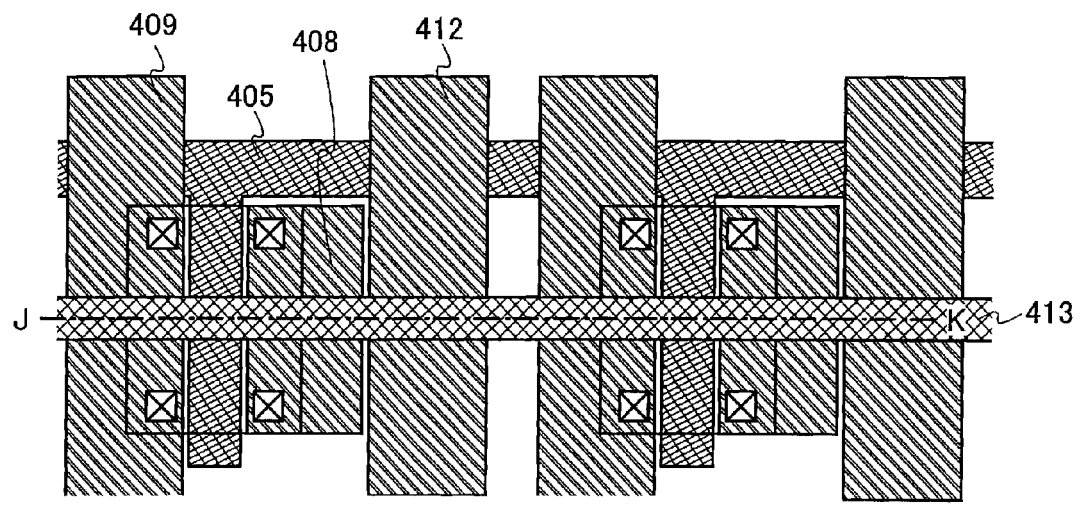

In this embodiment mode, FIGS. 4A and 4B show an example of a memory element which is partially different from the memory element shown in FIGS. 1A, 1B and 1C. FIG. 4A is a cross-sectional view of two memory elements, FIG. 4B is a top view of the two memory elements, and a diagram taken along a chain line J-K in FIG. 4B corresponds to FIG. 4A.

In FIG. 4A, similarly to FIG. 1A, a first insulating layer 402 is provided over a substrate 401 having an insulating surface, and a semiconductor layer 403 is provided over the first insulating layer 402. A second insulating layer 404 is provided over the first insulating layer 402 and the semiconductor layer 403. A word line (gate line) 405 is provided over the second insulating layer 404. A third insulating layer 406 is provided over the word line (gate line) 405, and a fourth insulating layer 407 is provided over the third insulating layer 406. A bit line 409, a first electrode 408, and a common electrode 412 are provided over the fourth insulating layer 407. The bit line 409, the first electrode 408, and the common electrode 412 are formed of the same material. A pair of right and left openings (contact holes), which reaches the semiconductor layer 403, is provided in the second insulating layer 404, the third insulating layer 406, and the fourth insulating layer 407. The bit line 409 is provided so as to cover one opening and the first electrode 408 is provided so as to cover the other opening. The bit line 409, the first electrode 408, and the common electrode 412 are provided over the same layer, that is, over the fourth insulating layer 407.

The semiconductor layer 403, the gate line (word line) 405, the first electrode 408, and the bit line 409 form a transistor.

A material which can be easily hardened is desirably used for a layer 413 containing an organic compound. By using the material which can be easily hardened for the layer 413 containing an organic compound, the pair of fifth insulating layers 114 shown in FIG. 1B is not required to be provided. Further, in a case where the layer 413 containing an organic compound is selectively formed by using an evaporation mask by an evaporation method, the pair of fifth insulating layers 114 shown in FIG. 1B is not required to be provided.

In the memory element shown in FIG. 4A, the layer 413 containing an organic compound covers and in contact with both side surfaces of the bit line 409, both side surfaces of the first electrode 408, and both side surfaces of the common electrode 412.

Further, as shown in FIG. 4B, the layer 413 containing an organic compound is formed in a band shape (also referred to as a line-shape). In addition, the pair of fifth insulating layers 114 shown in FIG. 1B may also be formed. In such a case, the pair of fifth insulating layers is also formed in a band shape (also referred to as a line-shape) parallel to the layer 413 containing an organic compound.

When viewed from above, the layer 413 containing an organic compound in the memory element shown in FIG. 4B has a shape different from the layer 113 containing an organic compound shown in FIG. 1B. The memory element shown in FIGS. 4A and 4B has a structure in which the width of the layer 413 containing an organic compound can be made wider, and thus, an allowable range of misalignment in forming the layer 413 containing an organic compound can be made wider.

Further, in the memory element shown in FIG. 4A, a protective layer may also be provided so as to cover the fourth insulating layer 407, the bit line 409, the first electrode 408, the common electrode 412, and the layer 413 containing an organic compound.

This embodiment mode can be arbitrarily combined with Embodiment Mode 1, 2 or 3.

(Embodiment Mode 5)

Figure 5A:
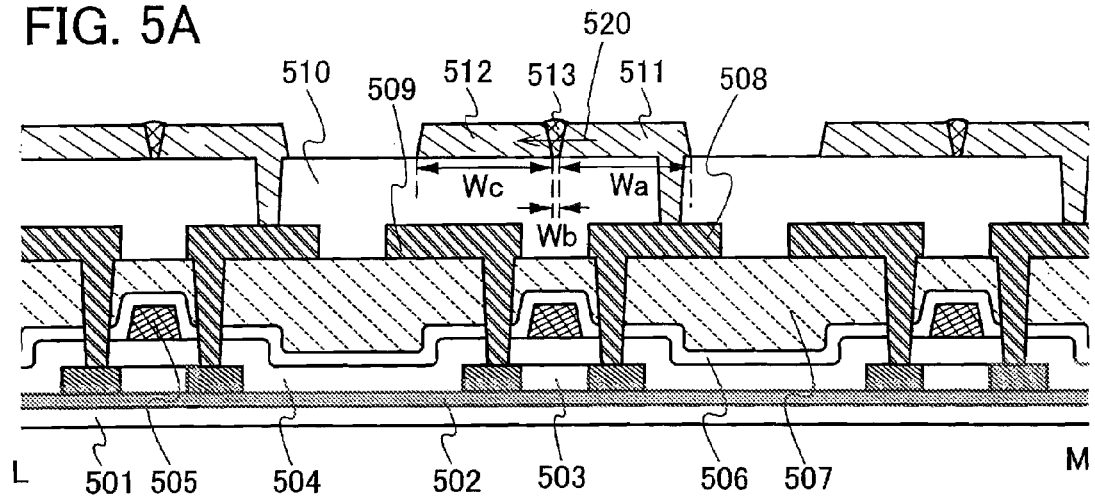
FIG. 5A is a cross-sectional view of a semiconductor device according to the present invention and FIG. 5B is a top view thereof (Embodiment Mode 5)
Figure 5B:
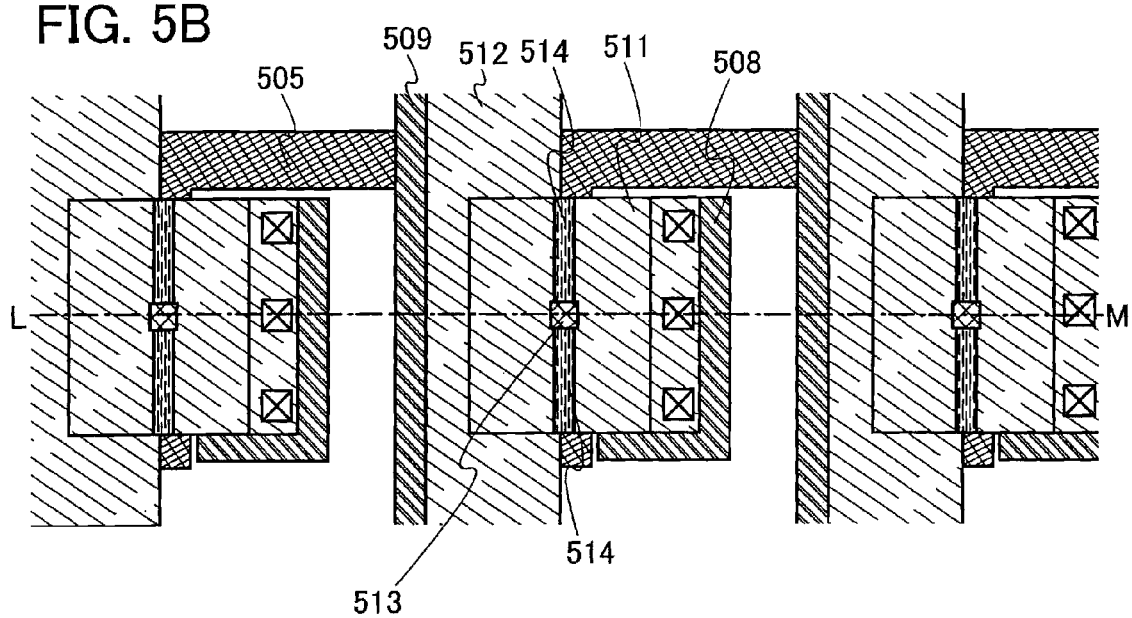

In this embodiment mode, FIGS. 5A and 5B show an example of a memory element which is partially different from the memory element shown in FIGS. 1A, 1B and 1C. FIG. 5A is a cross-sectional view of three memory elements, FIG. 5B is a top view of the three memory elements, and a diagram taken along a chain line L-M in FIG. 5B corresponds to FIG. 5A.

In FIG. 5A, similarly to FIG. 1A, a first insulating layer 502 is provided over a substrate 501 having an insulating surface, and a semiconductor layer 503 is provided over the first insulating layer 502.

A second insulating layer 504 is provided over the first insulating layer 502 and the semiconductor layer 503. A word line (gate line) 505 is provided over the second insulating layer 504. A third insulating layer 506 is provided over the word line (gate line) 505, and a fourth insulating layer 507 is provided over the third insulating layer 506. A bit line 509 and a connection electrode 508 are provided over the fourth insulating layer 507.

The bit line 509 and the connection electrode 508 are formed of the same material. A pair of right and left openings (contact holes), which reaches the semiconductor layer 503, is provided in the second insulating layer 504, the third insulating layer 506, and the fourth insulating layer 507. The bit line 509 is provided so as to cover one opening and the connection electrode 508 is provided so as to cover the other opening. A fifth insulating layer 510 is provided over the fourth insulating layer 507, the bit line 509, and the connection electrode 508.

A first electrode 511, a common electrode (second electrode) 512 are provided over the fifth insulating layer 510. The first electrode 511 and the common electrode 512 are formed of the same material. An opening (contact hole) which reaches the connection electrode 508 is provided in the fifth insulating layer 510. The first electrode 511 is provided so as to cover this opening. That is to say, the first electrode 511 and the common electrode 512 are provided over the same insulating layer.

The semiconductor layer 503, the gate line (word line) 505, the connection electrode 508, and the bit line 509 form a transistor.

In addition, as shown in FIG. 5B, a pair of sixth insulating layers (a pair of partition walls) 514 is provided so as to sandwich the layer 513 containing an organic compound. The pair of sixth insulating layers 514 is formed to have a film thickness of 0.1 to 0.5 in a direction perpendicular to the substrate surface. Since the layer 513 containing an organic compound is surrounded by the first electrode 511, the common electrode 512, and the pair of sixth insulating layers 514 as shown in FIG. 5B, an organic material used for the layer 513 containing an organic compound a highly fluid material can also be used.

The memory element of this embodiment mode can be overlapped with the transistor through the fifth insulating layer 510 therebetween, so that integration of an element can be achieved. A distance between adjacent memory elements can be reduced, so that further miniaturization can be expected.

In addition, in the memory element shown in FIG. 5A, a protective layer may also be provided so as to cover the fifth insulating layer 510, the first electrode 511, the common electrode 512, and the layer 513 containing an organic compound.

This embodiment mode can be arbitrarily combined with Embodiment Mode 1, 2, 3 or 4.

(Embodiment Mode 6)

Figure 6A:
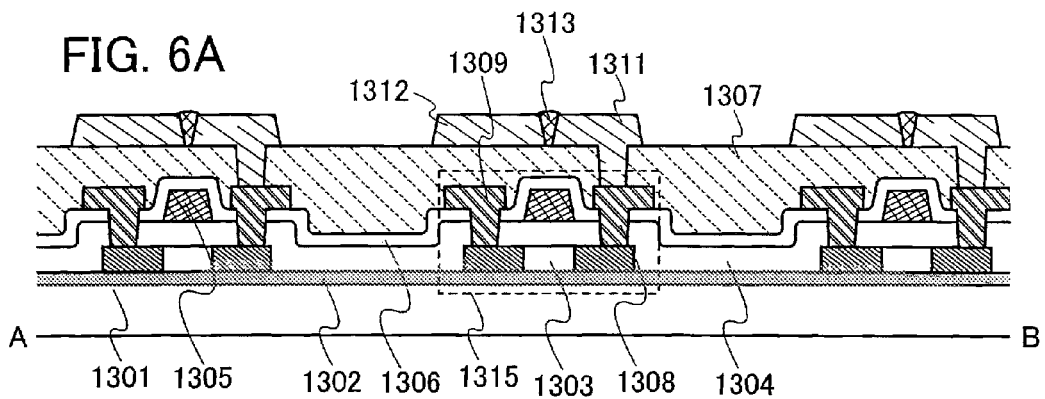
FIGS. 6A and 6C are cross-sectional views of a semiconductor device according to the present invention and FIG. 6B is a top view thereof (Embodiment Mode 6)
Figure 6B:
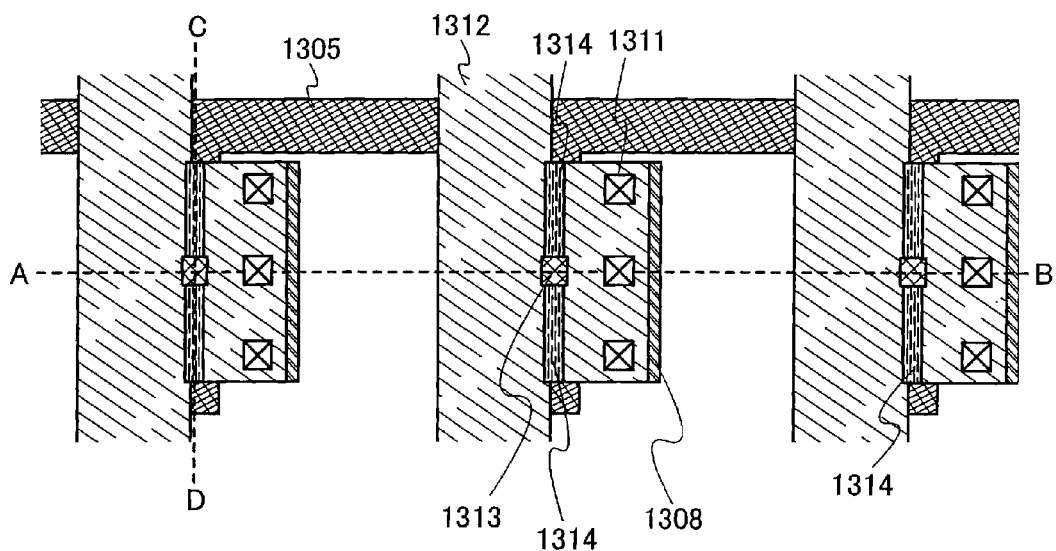
Figure 6C:
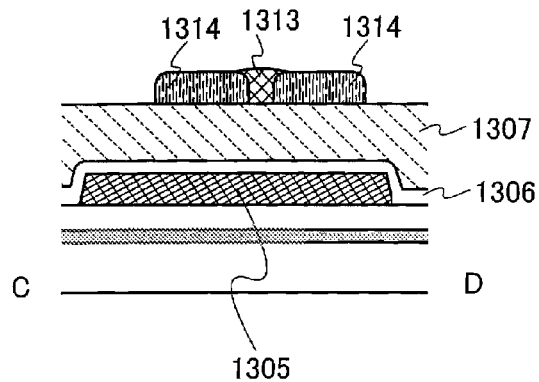

In this embodiment mode, FIGS. 6A and 6B show an example of a memory element which is partially different from the memory element shown in FIGS. 1A, 1B and 1C. FIG. 6A is a cross-sectional view of the memory element, and FIG. 6B is a top view corresponding to FIG. 6A.

In FIG. 6A, similarly to FIG. 1A, a first insulating layer 1302 is provided over a substrate 1301 having an insulating surface, and a semiconductor layer 1303 is provided over the first insulating layer 1302. A second insulating layer 1304 is provided over the first insulating layer 1302 and the semiconductor layer 1303. A word line (gate line) 1305 is provided over the second insulating layer 1304. A third insulating layer 1306 is provided over the word line (gate line) 1305. A pair of right and left openings (contact holes), which reaches the semiconductor layer 1303, is provided in the second insulating layer 1304 and the third insulating layer 1306. Over the third insulating layer 1306, a bit line 1309 is provided so as to cover one opening and a connection electrode 1308 is provided so as to cover the other opening. The bit line 1309 and the connection electrode 1308 are formed of the same material. A fourth insulating layer 1307 is provided over the third insulating layer 1306, the bit line 1309, and the connection electrode 1308. An opening (contact hole) which reaches the connection electrode is provided in the fourth insulating layer 1307. Over the fourth insulating layer 1307, a first electrode 1311 is provided so as to cover the opening and a common electrode (second electrode) 1312 is provided.

The semiconductor layer 1303, the gate line (word line) 1305, the connection electrode 1308, and the bit line 1309 form a transistor 1315.

In this embodiment mode, the memory element can be overlapped with the transistor 1315 through the fourth insulating layer 1307 therebetween. Therefore, a layer 1313 containing an organic compound can be formed in the upper part of the transistor. The distance between adjacent memory elements can be reduced, so that further miniaturization can be expected.

In FIG. 6A, the layer 1313 containing an organic compound is in contact with both of a side surface of the first electrode 1311 and a side surface of the common electrode 1312.

In addition, as shown in FIG. 6B, a pair of fifth insulating layers (a pair of partition walls) 1314 is provided so as to sandwich the layer 1313 containing an organic compound. The pair of fifth insulating layers 1314 is formed to have a film thickness of 0.1 to 0.5 μm in a direction perpendicular to the substrate surface. Since the layer 1313 containing an organic compound is surrounded by the first electrode 1311, the common electrode 1312, and the pair of fifth insulating layers 1314 as shown in FIG. 6B, a highly fluid material can also be used for an organic material used for the layer 1313 containing an organic compound.

Further, in the memory element shown in FIG. 6A, a protective layer may also be provided so as to cover the first electrode 1311, the common electrode 1312, and the layer 1313 containing an organic compound.

This embodiment mode can be arbitrarily combined with Embodiment Mode 1, 2, 3, 4 or 5.

(Embodiment Mode 7)

In this embodiment mode, a semiconductor device of the present invention will be described using equivalent circuit schematics shown in FIGS. 7A and 7B.

An example of a structure of a memory device described in this embodiment mode includes a column decoder 801, a row decoder 802, a reading circuit 804, a writing circuit 805, a selector 803, and a memory cell array 822. The memory cell array 822 includes a bit line Bm ($1 \leq m \leq x$), a word line Wn ($1 \leq n \leq y$), and x×y memory cells 821 at intersections of the bit line and the word line.

The memory cell 821 includes a first wire which forms a bit line Bx ($1 \leq x \leq m$), a second wire which forms a word line Wy ($1 \leq y \leq n$), a transistor 840, and a memory element 841. The memory element 841 includes a structure in which a layer containing an organic compound is interposed between a pair of conductive layers which are arranged in parallel, as any one of the memory elements shown in Embodiment Modes 1 to 6. Note that the structure of the memory device 816 shown here is only an example, and other circuits such as a sense amplifier, an output circuit, and a buffer may be included in the memory device, or a writing circuit may be provided in a bit line driver circuit.

The column decoder 801 receives an address signal to specify a column of the memory cell array, and gives a signal to the selector 803 of the specified column. The selector 803 receives the signal from the column decoder 801, and selects a bit line of the specified column. The row decoder 802 receives an address signal to specify a row of the memory cell array, and selects a word line of the specified row. In accordance with the operation described above, one memory cell 821 in response to the address signal is selected. The reading circuit 804 reads data stored in a memory element of the selected memory cell, and amplifies and outputs the data. The writing circuit 805 generates voltage required for writing, and applies the voltage to a memory element of the selected memory cell to write data.

Figure 7A:
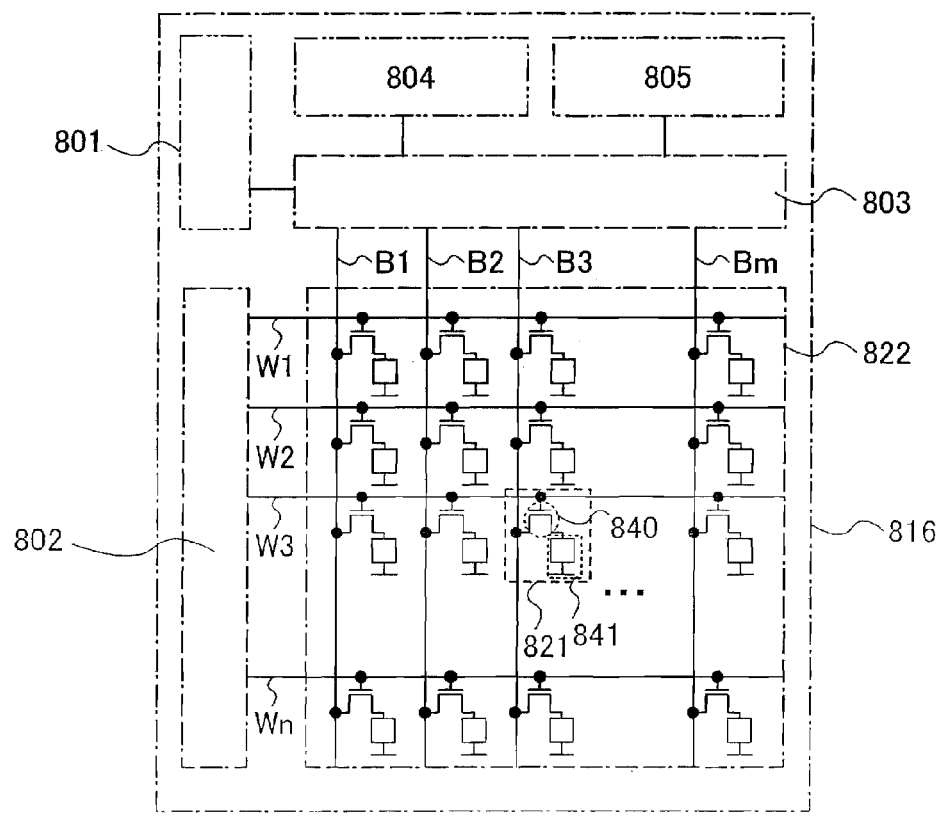
FIGS. 7A and 7B are equivalent circuit schematics according to the present invention (Embodiment Mode 7)
Figure 7B:
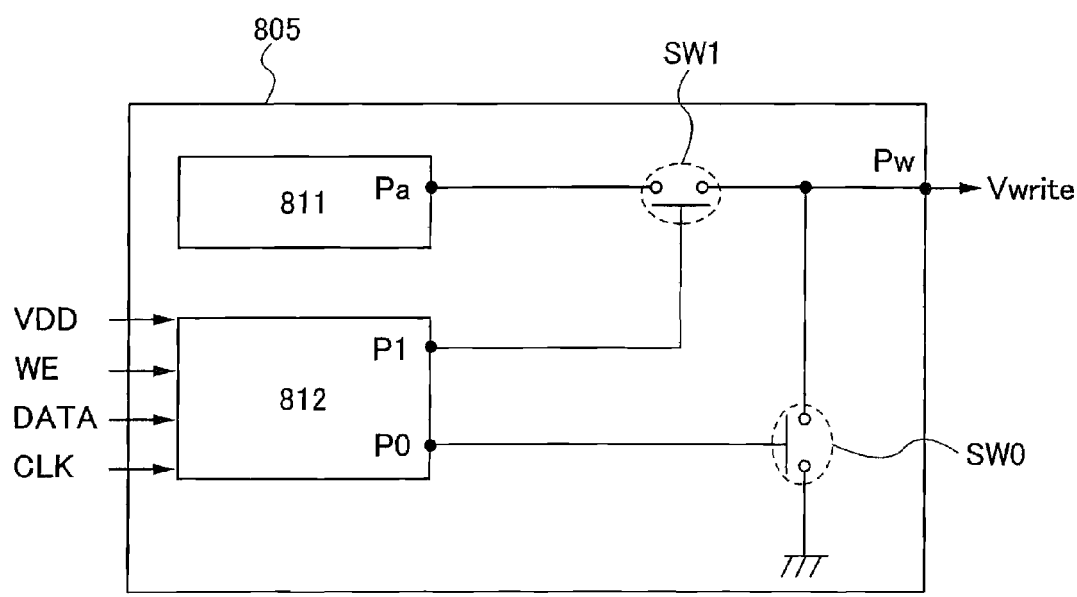

FIG. 7B shows a structure of the writing circuit 805 of the memory device according to the present invention. The writing circuit 805 includes a voltage generating circuit 811, a timing control circuit 812, switches SW0 and SW1, and an output terminal Pw. The voltage generating circuit 811 is formed by using a boosting circuit or the like and generates voltage V1 required for writing, which is outputted from an output terminal Pa. The timing control circuit 812 generates signals S0 and S1 controlling the switches SW0 and SW1, respectively, based on a writing control signal (referred to as WE), a data signal (referred to as DATA), a clock signal (referred to as CLK), and the like, and outputs the signals S0 and S1 from output terminals P0 and P1, respectively. The switch SW0 controls a connection with the ground, and the switch SW1 controls a connection with the output terminal Pa of the voltage generating circuit 811. Output voltage Vwrite from the output terminal Pw of the writing circuit can be switched whether any of these switches SW0 and SW1 is on a connection state.

Next, a writing operation is explained, where an initial state in which conductivity of the memory element is not changed is referred to as "0" and a short-circuit state in which conductivity of the memory element is changed is referred to as "1". First, an input signal WE turns to High level, the column decoder 801 which has received an address signal to specify a column gives a signal to the selector 803 of the specified column, and the selector 803 connects the bit line of the specified column to the output terminal Pw of the writing circuit. The bit line which is not specified is in a non-connection (referred to as floating) state. The output voltage Vwrite of the writing circuit is V1 and the voltage V1 is applied to the bit line of the specified column. Similarly, the row decoder 802, which has received an address signal to specify a row, applies voltage V2 to the word line of the specified row and 0V to the word line which is not specified. In accordance with the above-described operation, one memory element 841 in response to the address signal is selected. At this time, 0V is applied to a second electrode of the memory element 841.

At the same time, by receiving an input signal (DATA) in High level, the voltage generating circuit 811 can generate voltage V1 and output the voltage V1 from the output terminal Pa. The timing control circuit 812 can generate signals S0=Low and S1=High controlling the switches SW0 and SW1, respectively, based on input signals WE, DATA, CLK, a power supply potential (VDD), and the like, and output the signals S0 and S1 from the output terminals P0 and P1, respectively. By the above signals S0 and S1, the switch SW0 is turned off and the switch SW1 is turned on, and the writing circuit 805 can output voltage V1 as the output voltage Vwrite from the output terminal Pw.

In the selected memory element, by the operation described above, the voltage V2 is applied to the word line, the voltage V1 is applied to the bit line, and 0V is applied to the second electrode. Then, an impurity region of a thin film transistor is made conductive, and the voltage V1 of the bit line is applied to a first electrode of the memory element. As a result, conductivity of the memory element is changed to be in a short-circuit state, and "1" is written to the memory element.

When the input signal WE turns to Low level (low voltage which disables writing), all the word lines have 0V, and all the bit lines and the second electrodes of the memory elements are in a floating state. At this time, the timing control circuit 812 generates signals S0 and S1 in low level, which are outputted from the output terminals P0 and P1. The output terminal Pw is in a floating state. In accordance with the operation described above, writing of "1" is terminated.

Subsequently, writing of "0" is explained. When writing of "0" is performed, conductivity of the memory element is not changed, and voltage is not applied to the memory element. In other words, writing of "0" can be achieved by keeping an initial state. First, when the input signal WE turns to High level (high voltage which enables writing) similar to the case in which data of "1" is written, the column decoder 801 which has received an address signal to specify a column gives a signal to the selector 803 of the specified column, and the selector 803 connects the bit line of the specified column to the output terminal Pw of the writing circuit 805. At this time, the bit line which is not specified is in a floating state. Similarly, the row decoder 802 which has received an address signal to specify a row applies the voltage V2 to the word line of the specified row and 0V to the word line which is not specified. By the operation described above, one memory element 841 in response to the address signal is selected. At this time, 0V is applied to the second electrode of the memory element 841.

At the same time, by receiving an input signal DATA in Low level, the timing control circuit 812 generates control signals S0=High and S1=Low, and outputs the control signals S0 and S1 from the output terminals P0 and P1, respectively. By the control signals S0 and S1, the switch SW0 is turned on and the switch SW1 is turned off and 0V is outputted as the output voltage Vwrite from the output terminal Pw.

In the selected memory element, by the operation described above, V2 is applied to the word line, and 0V is applied to the bit line and the common electrode (the second electrode). Therefore, voltage is not applied to the memory element, and conductivity in the memory element is not changed, and thus, an initial state "0" is kept.

When the input signal WE turns to Low level, all the word lines have 0V, and all the bit lines and the second electrodes are in a floating state. At the same time, the timing control circuit 812 generates Lo as signals S0 and S1, which are outputted from the output terminals P0 and P1, respectively, and the output terminal Pw is in a floating state. In accordance with the operation described above, writing of "0" is terminated.

In such a manner, writing of "1" or "0" can be performed and terminated.

In addition, the memory cell array 822 includes a plurality of transistors 840 each of which functions as a switching element and a plurality of memory elements 841 each of which is connected to each transistor 840 over a substrate having an insulating surface.

As shown in FIGS. 7A and 7B, the memory cell 821 includes the transistor 840 and the memory element 841. The memory element 821 is denoted by using a rectangle in an attached diagram of this specification. A gate electrode of each transistor 840 is connected to the word line, one high concentration impurity region of each transistor 840 is connected to the bit line, and the other high concentration impurity region of each transistor 840 is connected to a first electrode of the memory element 841. A second electrode of the memory element is conduct to the second electrodes of all the memory elements in the memory cell array. When the memory device is operated, in other words, at the time of reading or writing, constant voltage is applied to all the second electrodes. Therefore, there is a case where the second electrode is referred to as a common electrode in this specification.

This embodiment mode can be arbitrarily combined with Embodiment Mode 1, 2, 3, 4, 5, or 6.

(Embodiment Mode 8)

Figure 8:
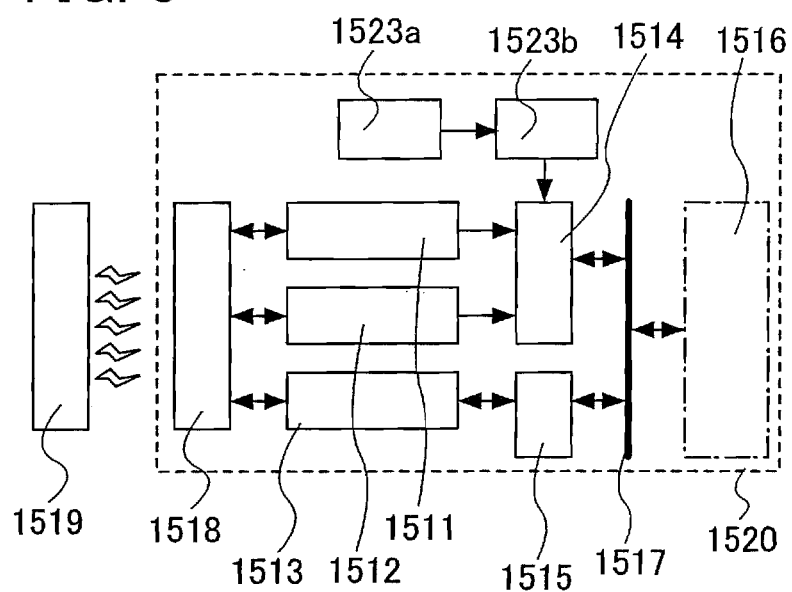
FIG. 8 is a diagram illustrating a structure example of a semiconductor device according to the present invention (Embodiment Mode 8)

A structure of a semiconductor device of this embodiment mode will be explained with reference to FIG. 8. As shown in FIG. 8, a semiconductor device 1520 according to the present invention has a function of non-contact communication of data, and includes a power supply circuit 1511, a clock generating circuit 1512, a data demodulation/modulation circuit 1513, a control circuit 1514 for controlling other circuits, an interface circuit 1515, a memory circuit 1516, a data bus 1517, an antenna (antenna coil) 1518, a sensor 1523a, and a sensor circuit 1523b.

The power supply circuit 1511 generates various kinds of power sources to be supplied to each circuit inside the semiconductor device 1520, based on an AC signal inputted from the antenna 1518. The clock generating circuit 1512 generates various kinds of clock signals to be supplied to each circuit inside the semiconductor device 1520 based on the AC signal inputted from the antenna 1518. The data demodulation/modulation circuit 1513 has a function of demodulating/modulating data communicated with a reader/writer 1519. The control circuit 1514 has a function of controlling the memory circuit 1516. The antenna 1518 has a function of transmitting/receiving a radio wave. The reader/writer 1519 communicates with and controls the semiconductor device, and controls processing of the data thereof. Note that the structure of the semiconductor device is not limited to the above structure, and for example, other elements such as a limiter circuit of power supply voltage and hardware dedicated to encryption processing may be added in the semiconductor device.

The memory circuit 1516 includes a memory element in which a layer containing an organic compound which is changed by external electric action is interposed between a pair of conductive layers, shown in Embodiment Modes 1 to 6. Note that the memory circuit 1516 may include only the memory element in which a layer containing an organic compound is interposed between a pair of conductive layers. Also, the memory circuit may include another memory circuit having a different structure. The memory circuit having a different structure corresponds to, for example, one or more selected from a DRAM, an SRAM, an FeRAM, a mask ROM, a PROM, an EPROM, an EEPROM, or a flash memory.

The sensor 1523a is formed by using a semiconductor element such as a resistor element, a capacitive coupling element, an inductive coupling element, a photovoltaic element, a photoelectric conversion element, a thermal electromotive force element, a transistor, a thermistor, or a diode. The sensor circuit 1523b detects a change in impedance, reactance, inductance, voltage, or current, and performs analog/digital conversion (A/D conversion) to output a signal to the control circuit 1514.

This embodiment mode can be arbitrarily combined with Embodiment Mode 1, 2, 3, 4, 5, 6 or 7.

(Embodiment Mode 9)

Figure 10A:
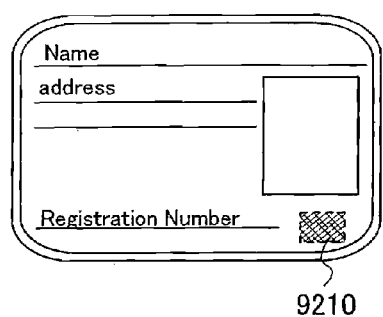
FIGS. 10A to 10F are views illustrating electronic devices each having a semiconductor device according to the present invention (Embodiment Mode 10).
Figure 10B:
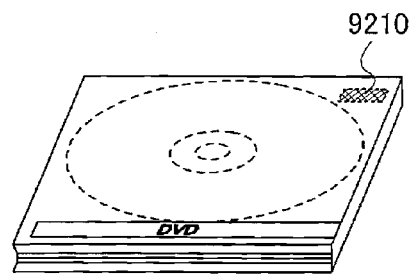
Figure 10C:
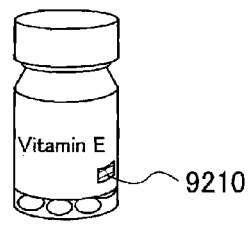
Figure 10D:
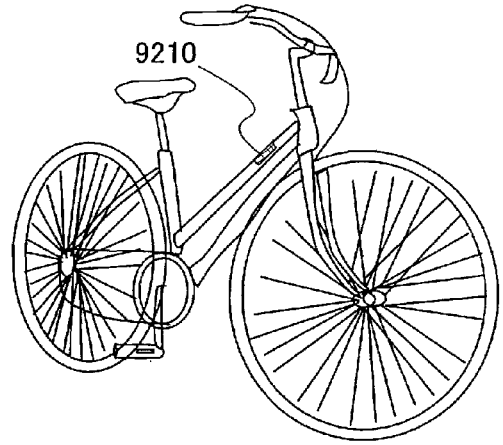
Figure 10E:
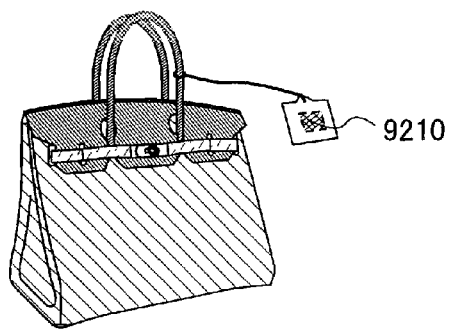
Figure 10F:
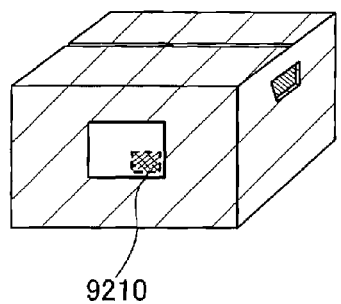

In accordance with the present invention, a semiconductor device functioning as a wireless chip can be formed. A wireless chip can be used broadly, and may be used by being mounted in objects such as bills, coins, securities, bearer bonds, certificates (driver's licenses, resident cards, and the like, refer to FIG. 10A), containers for wrapping objects (wrapping paper, bottles, and the like, refer to FIG. 10C), recording media (DVD software, video tapes, and the like, refer to FIG. 10B), vehicles (bicycles and the like, refer to FIG. 10D), personal belongings (bags, glasses, and the like), foods, plants, animals, human bodies, clothes, livingware, and products such as electronic devices, or shipping tags of baggage (refer to FIGS. 10E and 10F). The electronic device indicates a liquid crystal display device, an EL display device, a television unit (also simply referred to as a TV, a TV receiver, or a television receiver), a cellular phone, or the like.

The semiconductor device 9210 according to the present invention is mounted on a printed substrate, attached to a surface, or incorporated to be fixed in an object. For example, the semiconductor device is incorporated in paper of a book, or an organic resin of a package to be fixed in each object. As for the semiconductor device 9210 according to the present invention, downsizing, a thinner shape and light weight are achieved, and an attractive design of the object itself is not damaged even after fixing the semiconductor device in the object. In addition, by providing the semiconductor device 9210 according to the present invention in bills, coins, securities, bearer bonds, certificates, and the like, a certification function can be obtained and forgery thereof can be prevented by making the use of the certification function. Further, by providing the semiconductor device 9210 according to the present invention in containers for wrapping objects, recording media, personal belongings, foods, clothes, livingware, electronic devices, and the like, a system such as an inspection system can be more efficient.

Figure 9:
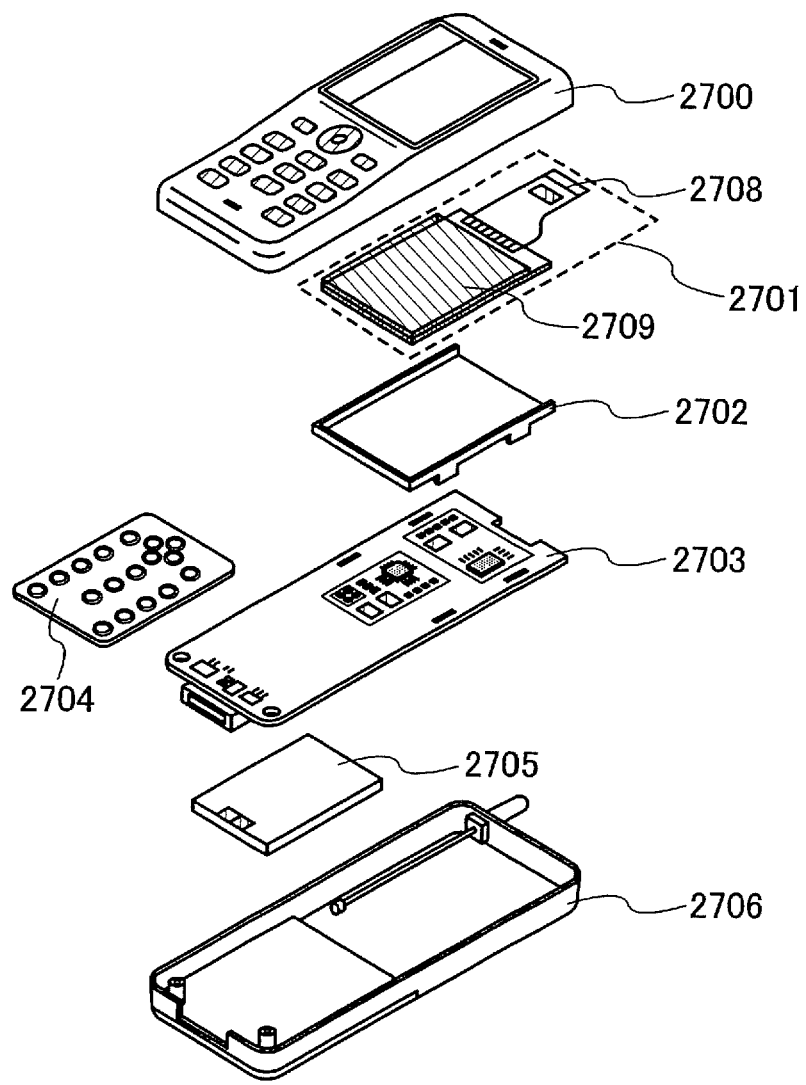
FIG. 9 is a view illustrating a usage mode of a semiconductor device according to the present invention (Embodiment Mode 9)

Subsequently, an example of an electronic device mounted with the semiconductor device according to the present invention is explained with reference to the drawing. The electronic device illustrated here is a cellular phone, which includes chassis 2700 and 2706, a panel 2701, a housing 2702, a printed wiring board 2703, operation buttons 2704, and a battery 2705 (refer to FIG. 9). The panel 2701 is incorporated in the housing 2702 to be detachable, and the housing 2702 is mounted on the printed wiring board 2703. As for the housing 2702, a shape and a size thereof are changed depending on an electronic device in which the panel 2701 is incorporated as appropriate. A plurality of semiconductor devices which are packaged is mounted on the printed wiring board 2703, and as one of the semiconductor devices, the semiconductor device according to the present invention can be used. Each of the plurality of semiconductor devices mounted on the printed wiring board 2703 has a function of a controller, a central processing unit (CPU), a memory, a power supply circuit, an audio processing circuit, a transmit/receive circuit, or the like.

The panel 2701 is fixed to the printed wiring board 2703 using a connection film 2708. The panel 2701, the housing 2702, and the printed wiring board 2703 are stored in the chassis 2700 and 2706 with the operation buttons 2704 and the battery 2705. A pixel region 2709 included in the panel 2701 is arranged so as to be seen through an aperture provided in the chassis 2700.

As described above, the semiconductor device according to the present invention has effects of small size, thin shape, and light weight. By these effects, a limited space inside the chassis 2700 and 2706 of the electronic device can be used efficiently.

In addition, since the semiconductor device according to the present invention includes a memory element having a simple structure in which a layer containing an organic compound which is changed by external electric action is interposed between a pair of conductive layers, an electronic device using an inexpensive semiconductor device can be provided. Further, since the semiconductor device according to the present invention can be easily highly integrated, an electronic device using a semiconductor device having a large-capacity memory circuit can be provided. As the memory element included in the semiconductor device according to the present invention, the memory element shown in any one of Embodiment Modes 1 to 6 can be used.

In addition, in the memory device included in the semiconductor device according to the present invention, data can be written by external electric action, and the memory device is nonvolatile in which data can be written additionally. With this feature, forgery by rewriting can be prevented, and new data can be additionally written. Therefore, an electronic device using a semiconductor device in which higher function and higher added-value are achieved can be provided.

Note that the chassis 2700 and 2706 are shown as an example of an appearance shape of a cellular phone, and the electronic device relating to this embodiment mode can be changed to various modes in accordance with a function or an application thereof.

This embodiment mode can be arbitrarily combined with Embodiment Mode 1, 2, 3, 4, 5, 6, 7 or 8.

This application is based on Japanese Patent Application serial No. 2005-234589 filed in Japan Patent Office on Aug. 12, 2005, the entire contents of which are hereby incorporated by reference.

What is claimed is:

1. A method for manufacturing a semiconductor device including a memory element comprising the steps of:
   forming a semiconductor layer over a substrate having an insulating surface;
   forming an insulating film which covers the semiconductor layer;
   forming a pair of electrodes, one of which is electrically connected to the semiconductor layer, on the same plane over the insulating film;
   forming a pair of insulating layers over the insulating film; and
   forming a layer containing an organic compound surrounded by the pair of electrodes and the pair of insulating layers.

2. The method for manufacturing the semiconductor device according to claim 1, wherein a shape of the layer containing the organic compound when viewed from above is a rectangular shape, an elliptical shape, a circular shape, or a band shape.

3. The method for manufacturing the semiconductor device according to claim 1, wherein the semiconductor layer has at least one of an amorphous structure, a microcrystalline structure, a polycrystalline structure, and a single crystal structure.

4. The method for manufacturing the semiconductor device according to claim 1, wherein the semiconductor layer comprises an organic compound.

5. The method for manufacturing the semiconductor device according to claim 1, wherein the layer containing the organic compound is irreversibly changed from a high-resistance state to a low-resistance state.

6. The method for manufacturing the semiconductor device according to claim 1, wherein a side surface of each of the pair of electrodes has a tapered shape.

7. The method for manufacturing the semiconductor device according to claim 1, wherein the other one of the pair of electrodes is a common electrode.

8. A method for manufacturing a semiconductor device including a memory element comprising the steps of:
   forming a semiconductor layer over a substrate having an insulating surface;
   forming an insulating film which covers the semiconductor layer;
   forming a pair of electrodes, one of which is electrically connected to the semiconductor layer, on the same plane over the insulating film;
   forming a pair of insulating layers over the insulating film; and then
   forming a layer containing an organic compound so as to overlap a region which is surrounded by the pair of electrodes and the pair of insulating layers.

9. The method for manufacturing the semiconductor device according to claim 8, wherein a shape of the layer containing the organic compound when viewed from above is a rectangular shape, an elliptical shape, a circular shape, or a band shape.

10. The method for manufacturing the semiconductor device according to claim 8, wherein the semiconductor layer has at least one of an amorphous structure, a microcrystalline structure, a polycrystalline structure, and a single crystal structure.

11. The method for manufacturing the semiconductor device according to claim 8, wherein the semiconductor layer comprises an organic compound.

12. The method for manufacturing the semiconductor device according to claim 8, wherein the layer containing the organic compound is irreversibly changed from a high-resistance state to a low-resistance state.

13. The method for manufacturing the semiconductor device according to claim 8, wherein a side surface of each of the pair of electrodes has a tapered shape.

14. The method for manufacturing the semiconductor device according to claim 8, wherein the other one of the pair of electrodes is a common electrode.

15. A method for manufacturing a semiconductor device including a memory element comprising the steps of:
   forming a switching element comprising a semiconductor layer over a substrate;

forming an insulating film over the switching element;

forming a first electrode electrically connected to the switching element, on an upper surface of the insulating film;

forming a second electrode on the upper surface of the insulating film;

forming a pair of insulating layers over the insulating film; and forming a layer containing an organic compound covering a gap surrounded by the first and second electrodes and the pair of insulating layers, selectively.

16. The method for manufacturing the semiconductor device according to claim 15, wherein the semiconductor layer has at least one of an amorphous structure, a microcrystalline structure, a polycrystalline structure, and a single crystal structure.

17. The method for manufacturing the semiconductor device according to claim 15, wherein the semiconductor layer comprises an organic compound.

18. The method for manufacturing the semiconductor device according to claim 15, wherein the layer containing the organic compound is irreversibly changed from a high-resistance state to a low-resistance state.

19. The method for manufacturing the semiconductor device according to claim 15, wherein a side surface of each of the first and second electrodes has a tapered shape.

20. The method for manufacturing the semiconductor device according to claim 15, wherein the second electrode is a common electrode.

21. The method for manufacturing the semiconductor device according to claim 15, wherein a shape of the layer containing the organic compound when viewed from above is a rectangular shape, an elliptical shape, a circular shape, or a band shape.

* * * * *